(12) United States Patent
Yoneda

(10) Patent No.: US 9,343,480 B2
(45) Date of Patent: May 17, 2016

(54) SEMICONDUCTOR DEVICE

(75) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 791 days.

(21) Appl. No.: 13/197,888

(22) Filed: Aug. 4, 2011

(65) Prior Publication Data
US 2012/0037972 A1    Feb. 16, 2012

(30) Foreign Application Priority Data

Aug. 16, 2010    (JP) .................................. 2010-181499
May 13, 2011    (JP) .................................. 2011-107887

(51) Int. Cl.
| | | |
|---|---|---|
| H01L 27/108 | (2006.01) | |
| H01L 27/12 | (2006.01) | |
| G11C 16/04 | (2006.01) | |
| H01L 27/115 | (2006.01) | |
| H01L 29/786 | (2006.01) | |

(52) U.S. Cl.
CPC ........ H01L 27/1225 (2013.01); G11C 16/0433 (2013.01); H01L 27/11517 (2013.01); H01L 27/1251 (2013.01); H01L 29/7869 (2013.01); H01L 29/78609 (2013.01)

(58) Field of Classification Search
USPC ................... 257/300–304, E27.084
See application file for complete search history.

(56) References Cited

U.S. PATENT DOCUMENTS

| | | |
|---|---|---|
| 4,466,081 A | 8/1984 | Masuoka |
| 5,219,779 A | 6/1993 | Suzuki |
| 5,731,856 A | 3/1998 | Kim et al. |
| 5,744,864 A | 4/1998 | Cillessen et al. |
| 5,796,650 A | 8/1998 | Wik et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

Primary Examiner — Lynne Gurley
Assistant Examiner — Vernon P Webb
(74) Attorney, Agent, or Firm — Fish & Richardson P.C.

(57) ABSTRACT

It is an object to give excellent data retention characteristics to a semiconductor device in which stored data is judged in accordance with the potential of a gate of a specified transistor, by achieving both reduction in variation of the threshold voltage of the transistor and data retention for a long time. Charge is held (data is stored) in a node electrically connected only to a source or a drain of a transistor whose channel region is formed using an oxide semiconductor. There may be a plurality of transistors whose sources or drains are electrically connected to the node. The oxide semiconductor has a wider band gap and a lower intrinsic carrier density than silicon. By using such an oxide semiconductor for the channel region of the transistor, the transistor with an extremely low off-state current (leakage current) can be realized.

12 Claims, 29 Drawing Sheets

(56) References Cited

U.S. PATENT DOCUMENTS

| | | | |
|---|---|---|---|
| 5,936,881 | A | 8/1999 | Kawashima et al. |
| 6,127,702 | A | 10/2000 | Yamazaki et al. |
| 6,266,269 | B1 | 7/2001 | Karp et al. |
| 6,294,274 | B1 | 9/2001 | Kawazoe et al. |
| 6,307,788 | B1 | 10/2001 | Tanaka |
| 6,317,365 | B1 | 11/2001 | Tanaka |
| 6,563,174 | B2 | 5/2003 | Kawasaki et al. |
| 6,628,551 | B2 | 9/2003 | Jain |
| 6,727,522 | B1 | 4/2004 | Kawasaki et al. |
| 6,798,006 | B2 | 9/2004 | Amo et al. |
| 6,808,971 | B2 | 10/2004 | Bhattacharyya |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 7,935,582 | B2 | 5/2011 | Iwasaki |
| 7,956,361 | B2 | 6/2011 | Iwasaki |
| 8,154,024 | B2 | 4/2012 | Iwasaki |
| 8,194,469 | B2 | 6/2012 | Tanaka et al. |
| 8,530,246 | B2 | 9/2013 | Ofuji et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0072467 | A1 | 3/2010 | Yamazaki et al. |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0108706 | A1* | 5/2011 | Koyama ............... 250/208.1 |

FOREIGN PATENT DOCUMENTS

| | | |
|---|---|---|
| EP | 2339639 A | 6/2011 |
| EP | 2816607 A | 12/2014 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-297962 A | 12/1990 |
| JP | 03-069092 A | 3/1991 |
| JP | 05-251705 A | 9/1993 |
| JP | 08-264794 A | 10/1996 |
| JP | 10-149675 A | 6/1998 |
| JP | 11-505377 A | 5/1999 |
| JP | 2000-040359 A | 2/2000 |
| JP | 2000-044236 A | 2/2000 |
| JP | 2000-150900 A | 5/2000 |
| JP | 2001-053164 A | 2/2001 |
| JP | 2002-076356 A | 3/2002 |
| JP | 2002-198499 A | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-214512 A | 7/2004 |
| JP | 2004-273614 A | 9/2004 |
| JP | 2004-273732 A | 9/2004 |
| JP | 2007-103918 A | 4/2007 |
| JP | 2009-182194 A | 8/2009 |
| JP | 2009-277702 A | 11/2009 |
| TW | 201021211 | 6/2010 |
| WO | 2004/114391 A1 | 12/2004 |
| WO | WO-2007/029844 | 3/2007 |

(56) References Cited

FOREIGN PATENT DOCUMENTS

| WO | WO-2009/139482 | 11/2009 |
| WO | WO-2010/032629 | 3/2010 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T et al.. "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al.. "Full-Functional System Liquid Crystal Display Using Cg—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures.Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 Inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Taiwanese Office Action (Application No. 100128158), dated Oct. 26, 2015.

\* cited by examiner

● : contact hole

FIG. 14A  FIG. 14B
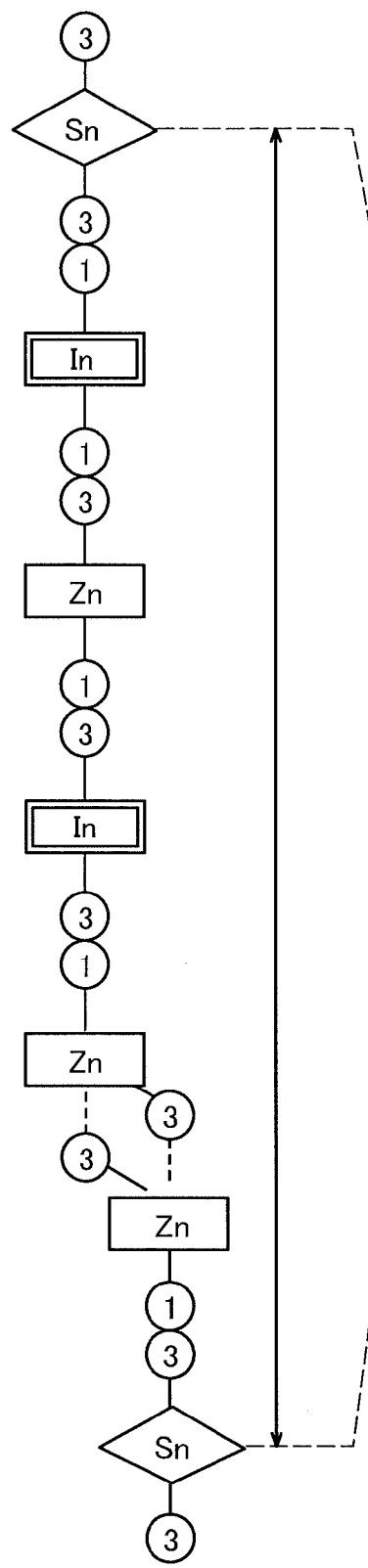
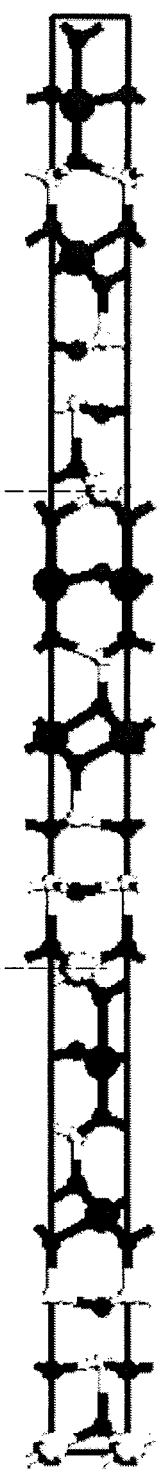
FIG. 14C
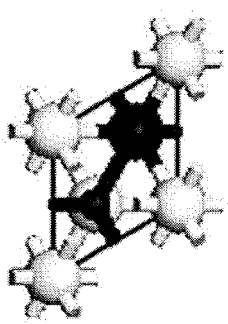
● In
☾ Sn
☾ Zn
● O

SEMICONDUCTOR DEVICE

BACKGROUND OF THE INVENTION

1. Field of the Invention

The present invention relates to a semiconductor device and a driving method thereof. The present invention particularly relates to a semiconductor device that stores data and a driving method thereof. Note that the semiconductor device in this specification indicates any device that can operate by utilizing semiconductor characteristics.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is DRAM (dynamic random access memory). DRAM stores data in such a manner that a transistor included in a storage element is selected and electric charge is stored in a capacitor.

When data is read from DRAM, electric charge in a capacitor is lost on the above principle; thus, another write operation is necessary every time data is read out. Moreover, since a transistor included in a storage element has a leakage current, electric charge flows into or out of a capacitor even if the transistor is not selected, whereby a data retention period is short. For that reason, another write operation (refresh operation) is necessary at predetermined intervals, and it is difficult to sufficiently reduce power consumption. Furthermore, since stored data is lost when power supply stops, an additional storage device using a magnetic material or an optical material is needed in order to hold data for a long time.

Another example of a volatile storage device is SRAM (static random access memory). SRAM retains stored data by using a circuit such as a flip-flop and thus does not need a refresh operation. This means that SRAM has an advantage over DRAM. However, cost per storage capacity is increased because of the use of a flip-flop or the like. Moreover, as in DRAM, stored data in SRAM is lost when power supply stops.

A typical example of a non-volatile storage device is flash memory. A flash memory includes a floating gate between a gate electrode and a channel region in a transistor and stores data by holding electric charge in the floating gate. Therefore, flash memory has advantages in that the data retention time is extremely long (almost permanent) and a refresh operation which is necessary in a volatile storage device is not needed (e.g., see Patent Document 1).

However, a gate insulating film included in a storage element deteriorates by tunneling current generated in writing, so that the storage element stops its function after a predetermined number of write operations. In order to reduce adverse effects of this problem, a method of equalizing the number of write operations for storage elements is employed, for example, in which case a complicated peripheral circuit is needed. Moreover, employing such a method does not solve the fundamental problem of lifetime. In other words, flash memory is not suitable for applications in which data is frequently rewritten.

In addition, flash memory needs high voltage for injecting electric charge in the floating gate or removing the electric charge, and a circuit for generating high voltage is also necessary. Further, it takes a relatively long time to inject or remove electric charge, so that it is not easy to increase the speed of write and erase operations.

REFERENCE

Patent Document 1: Japanese Published Patent Application No. S57-105889

SUMMARY OF THE INVENTION

In view of the foregoing problems, a semiconductor device with a novel structure, which can retain stored data even when power is not supplied and has no limitation on the number of write cycles, has been developed. The semiconductor device utilizes a transistor which has an extremely low current in the off state and whose channel region is formed using an oxide semiconductor. Specifically, in the semiconductor device, charge is retained (data is stored) in a node electrically connected to one of a source and a drain of the transistor. The charge (stored data) held in the node can be retained for a long time in the semiconductor device by turning off the transistor.

The threshold voltage ($V_{th}$) of a transistor whose channel region is formed using silicon can be represented by the following formula. In the formula, $\phi_{MS}$ represents flat-band voltage; $\phi_F$, Fermi level difference between silicon and an intrinsic semiconductor; $T_{OX}$, thickness of a gate insulating film; $\varepsilon_{OX}$, dielectric constant of the gate insulating film; $Q_{b0}$, fixed charge in a depletion layer; and $Q_{ss}$, charge caused by impurities and defects at the interface between the gate insulating film and silicon.

$$Vth = \phi_{MS} - 2\phi_F - \frac{T_{OX}}{\varepsilon_{OX}}(Q_{b0} - Q_{ss})$$

It is found from the above formula that the threshold voltage ($V_{th}$) of a transistor whose channel region is formed using silicon is shifted positively as the thickness of the gate insulating film is smaller (the value of $T_{OX}$ is smaller). In the case where variation in the thickness of the gate insulating film in the formation process depends on the thickness (i.e., in the case where variations in the thickness are expressed by $T_{OX} \pm \alpha T_{OX}$ ($0<\alpha<1$)), a reduction in thickness of the gate insulating film can reduce variation in the thickness of the gate insulating film. In other words, in that case, a reduction in thickness of the gate insulating film can reduce variation in threshold voltage. It is likely that this can be applied not only to the transistor whose channel region is formed using silicon but also to a transistor whose channel region is formed using another semiconductor.

However, the gate leakage current is increased as the thickness of the gate insulating film is reduced. In particular, in the above semiconductor device, when charge is retained (data is stored) in a node to which one of a source and a drain of a transistor whose channel region is formed using an oxide semiconductor and a gate of a transistor including a gate insulating film with a reduced thickness are electrically connected, it becomes difficult to retain charge (store data) because of the gate leakage current.

In view of the above, an object of one embodiment of the present invention is to give excellent data retention characteristics to a semiconductor device in which stored data is judged in accordance with the potential of a gate of a specified transistor, by achieving both reduction in variation of the threshold voltage of the transistor and data retention for a long time.

The above object can be achieved in such a manner that charge is held (data is stored) in a node electrically connected only to a source or a drain of a transistor whose channel region is formed using an oxide semiconductor. Note that there may be a plurality of transistors whose sources or drains are electrically connected to the node. Features of the oxide semiconductor are a wider band gap and a lower intrinsic carrier density than silicon. By using such an oxide semiconductor for the channel region of the transistor, the transistor with an extremely low off-state current (leakage current) can be realized.

In addition, the oxide semiconductor is preferably an i-type (intrinsic) or substantially intrinsic oxide semiconductor (purified OS) in which the concentration of impurities such as moisture or hydrogen that might serve as electron donors (donors) has been reduced. Specifically, the oxide semiconductor has a hydrogen concentration of $5 \times 10^{19}$ (atoms/cm$^3$) or less, preferably $5 \times 10^{18}$ (atoms/cm$^3$) or less, further preferably $5 \times 10^{17}$ (atoms/cm$^3$) or less when the hydrogen concentration is measured by secondary ion mass spectrometry (SIMS). The carrier density of the oxide semiconductor measured by Hall effect measurement is less than $1 \times 10^{14}$/cm$^3$, preferably less than $1 \times 10^{12}$/cm$^3$, further preferably less than $1 \times 10^{11}$/cm$^3$. The band gap of the oxide semiconductor is 2 eV or more, preferably 2.5 eV or more, further preferably 3 eV or more.

Here, analysis of the hydrogen concentration by secondary ion mass spectrometry (SIMS) is mentioned. It is known that it is difficult to accurately obtain data in the proximity of a surface of a sample or in the proximity of an interface between stacked films formed using different materials by the SIMS analysis in principle. Thus, in the case where distributions of the hydrogen concentrations of the film in the thickness direction are analyzed by SIMS, an average value in a region of the film where the value is not greatly changed and almost the same value can be obtained is employed as the hydrogen concentration. Further, in the case where the thickness of the film to be measured is small, a region where almost the same value can be obtained cannot be found in some cases because of the influence of the hydrogen concentration of the films adjacent to each other. In that case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

An oxide semiconductor to be used preferably contains at least indium (In) or zinc (Zn). In particular, the oxide semiconductor preferably contains In and Zn. As a stabilizer for reducing variation in electric characteristics of a transistor including the oxide semiconductor, the oxide semiconductor preferably contains gallium (Ga) in addition to In and Zn. Moreover, the oxide semiconductor preferably contains tin (Sn), hafnium (Hf), and/or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

Examples of the oxide semiconductor are an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, and an In—Hf—Al—Zn—O-based material which are oxides of four metal elements; an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Pm—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and In—Lu—Zn—O-based material which are oxides of three metal elements; an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material which are oxides of two metal elements; and an In—O-based material, a Sn—O-based material, and a Zn—O-based material. Note that in this specification, for example, an In—Sn—Ga—Zn—O-based material means a metal oxide containing indium (In), tin (Sn), gallium (Ga), and zinc (Zn). There is no particular limitation on the composition ratio. The above oxide semiconductor may contain silicon.

Further, a material represented by InMO$_3$(ZnO)$_m$ (m is larger than 0 and is not an integer) may be used as the oxide semiconductor. Note that M represents one or more metal elements selected from Ga, Fe, Al, Mn, and Co. As the oxide semiconductor, a material represented by In$_3$SnO$_5$(ZnO)$_n$ (n is larger than 0 and is an integer) may be used.

For example, it is possible to use an In—Ga—Zn—O-based material with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, it is possible to use an In—Sn—Zn—O-based material with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions.

Without limitation to the above, an oxide semiconductor with an appropriate composition ratio can be used in accordance with desired semiconductor characteristics (e.g., mobility, threshold voltage, and variation). In order to obtain needed semiconductor characteristics, an oxide semiconductor preferably has appropriate carrier density, impurity concentration, defect density, atomic ratio of a metal element to oxygen, bond distance, density, or the like.

For example, high mobility can be relatively easily obtained with an In—Sn—Z—O-based material. Even when an In—Ga—Zn—O-based material is used, the mobility can be increased by a reduction in bulk defect density.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \leq r^2$, and r may be 0.05, for example. The same can be applied to other oxides.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained with relative ease. When a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by the following formula.

$$Ra = \frac{1}{S_0} \int_{x_2}^{x_1} \int_{y_2}^{y_1} |f(x, y) - Z_0| dx dy \quad (A1)$$

Note that in the formula, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured with an atomic force microscope (AFM).

In the case where an In—Zn—O-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when a target used for forming an In—Zn—O-based material has an atomic ratio of In:Zn:O=X:Y:Z, the relation of Z>1.5X+Y is satisfied.

When an In—Sn—Zn—O-based material (can be referred to as ITZO) is used as the oxide semiconductor, an oxide target having a composition ratio of In:Sn:Zn=1:2:2, 2:1:3, 1:1:1, or 20:45:35 in an atomic ratio is used, for example.

In the semiconductor device according to one embodiment of the present invention, charge can be held (data can be stored) in a node electrically connected only to a source or a drain of a transistor whose channel region is formed using an oxide semiconductor. Leakage of charge due to gate leakage current is not caused at the node. For that reason, in a semiconductor device in which stored data is judged in accordance with the potential of a gate of a specified transistor, even when data is lost by the gate leakage current of the transistor, data can be restored by supply of charge from the node to the gate of the transistor. Consequently, the semiconductor device can achieve both reduction in variation of the threshold voltage of the transistor and data retention for a long time. That is, the semiconductor device with excellent data retention characteristics can be provided.

BRIEF DESCRIPTION OF THE DRAWINGS

In the accompanying drawings:

FIGS. 14A to 14C illustrate a crystal structure of an oxide material;

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

Embodiment 1

First, a semiconductor device according to one embodiment of the present invention will be described with reference to FIGS. 1A and 1B.

<Configuration Example of Semiconductor Device>

Figure 1A:
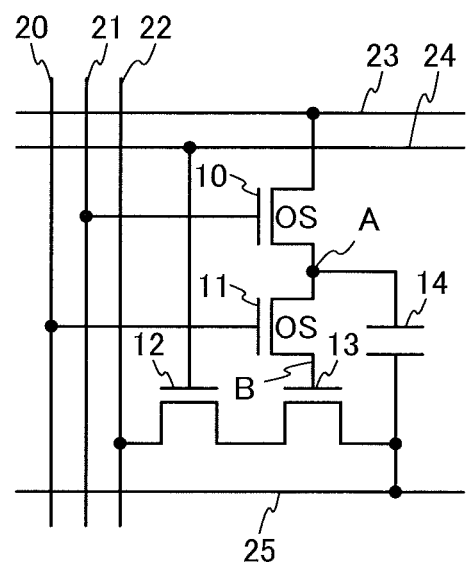
FIG. 1A is a circuit diagram illustrating a configuration example of a semiconductor device.

FIG. 1A is a circuit diagram illustrating a configuration example of a semiconductor device that can retain data. The semiconductor device in FIG. 1A includes transistors 10 and 11 in each of which a channel region is formed using an oxide semiconductor (represented by "OS" in FIG. 1A), transistors 12 and 13, a capacitor 14, signal lines 20 and 21, a bit line 22, a data line 23, a word line 24, and a fixed potential line 25. The transistors 12 and 13 are not limited to a transistor whose channel region is formed using an oxide semiconductor, and can be a transistor whose channel region is formed using another semiconductor such as silicon. Note that here, the transistors 10 to 13 are n-channel transistors.

Specifically, a gate of the transistor 10 is electrically connected to the signal line 21. One of a source and a drain of the transistor 10 is electrically connected to the data line 23. A gate of the transistor 11 is electrically connected to the signal line 20. One of a source and a drain of the transistor 11 is electrically connected to the other of the source and the drain of the transistor 10. A gate of the transistor 12 is electrically connected to the word line 24. One of a source and a drain of the transistor 12 is electrically connected to the bit line 22. A gate of the transistor 13 is electrically connected to the other of the source and the drain of the transistor 11. One of a source and a drain of the transistor 13 is electrically connected to the other of the source and the drain of the transistor 12. The other of the source and the drain of the transistor 13 is electrically connected to the fixed potential line 25. One electrode of the capacitor 14 is electrically connected to the other of the source and the drain of the transistor 10 and one of the source and the drain of the transistor 11. The other electrode of the capacitor 14 is electrically connected to the fixed potential line 25.

Note that in FIG. 1A, a node where the other of the source and the drain of the transistor 10, one of the source and the drain of the transistor 11, and one electrode of the capacitor 14 are electrically connected to each other is referred to as a node A. A node where the other of the source and the drain of the transistor 11 and the gate of the transistor 13 are electrically connected to each other is referred to as a node B.

The semiconductor device in FIG. 1A can store one-bit data. Specifically, in the semiconductor device in FIG. 1A, the state (the on state and the off state) of the transistor 13 can be controlled by controlling the potential of the node B so that the node B has a desired potential. Thus, data held in the semiconductor device can be judged by judging the state of the transistor 13. Note that data can be judged in the following manner, for example: a resistor that becomes electrically connected to one of the source and the drain of the transistor 13 through the bit line when the transistor 12 is on is provided, and resistance voltage division between the resistor and the transistor 13 is used.

Figure 1B:
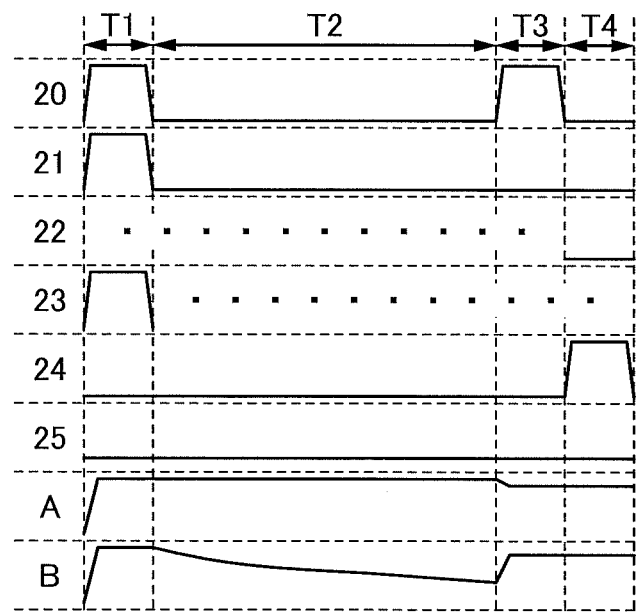
FIG. 1B illustrates an example of operation of the semiconductor device.

FIG. 1B illustrates an example of the operation for writing and reading data to/from the semiconductor device in FIG. 1A. Specifically, FIG. 1B shows the potentials of the signal lines 20 and 21, the bit line 22, the data line 23, the word line 24, the fixed potential line 25, the node A, and the node B in the operation. Note that here, the fixed potential line 25 is a wiring that supplies a low-level potential.

In the example of the operation illustrated in FIG. 1B, a high-level potential is supplied to the signal lines 20 and 21 and the data line 23 in a write period T1. Thus, the transistors 10 and 11 are turned on, and the potentials of the nodes A and B are increased to the high-level potential. Note that the potential of the word line 24 in the write period T1 is the low-level potential.

In a retention period T2, the low-level potential is supplied to the signal lines 20 and 21; thus, the transistors 10 and 11 are turned off. At this time, the potential of the node B is gradually decreased because the gate leakage current of the transistor 13 is generated. On the other hand, the potential of the node A that is brought into a floating state when the transistors 10 and 11, whose channel regions are formed using an oxide semiconductor, are turned off is hardly decreased in the retention period T2. Note that the potential of the word line 24 in the retention period T2 is the low-level potential.

In a refresh period T3, the high-level potential is supplied to the signal line 20; thus, the transistor 11 is turned on. Consequently, the node A and the node B are electrically connected to each other, and the potentials of these nodes become equal to each other. Specifically, charge is supplied from the node A to the node B. Therefore, even if the potential of the node B becomes lower than a potential needed to turn on the transistor 13 in the retention period T2, the potential of the node B can be made higher than or equal to the potential needed to turn on the transistor 13 in the refresh period T3. Note that the potentials of the signal line 21 and the word line 24 in the refresh period T3 are the low-level potentials.

In a read period T4, the high-level potential is supplied to the word line 24; thus, transistor 12 is turned on. Consequently, the bit line 22 and one of the source and the drain of the transistor 13 are electrically connected to each other. At that time, data stored in the semiconductor device can be judged by the above-described method, for example, in which a resistor that becomes electrically connected to one of the source and the drain of the transistor 13 through the bit line is provided, and resistance voltage division between the resistor and the transistor 13 is used. Note that the potentials of the signal lines 20 and 21 in the read period T4 are the low-level potentials.

As described above, in the semiconductor device according to one embodiment of the present invention, even if data is lost by the gate leakage current of the transistor 13, data can be restored by supply of charge from the node A to the node B.

<Off-State Current of Transistor Whose Channel Region is Formed with Oxide Semiconductor>

Here, the results of measuring the off-state current (leakage current) of a transistor whose channel region is formed with an oxide semiconductor will be described.

First, a method for forming a transistor used for the measurement will be described with reference to FIGS. 2A to 2H.

Figure 2A:
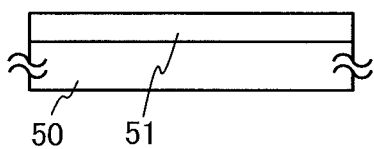
FIGS. 2A to 2H illustrate an example of a method for forming a transistor.
Figure 2B:
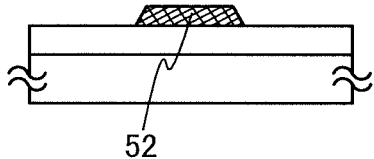

First, a base layer 51 formed of a stack of a 100-nm-thick silicon nitride layer and a 150-nm-thick silicon oxynitride layer was formed by CVD over a glass substrate 50 (see FIG. 2A).

Next, a 100-nm-thick tungsten layer was formed by sputtering over the base layer 51. Then, the tungsten layer was selectively etched by photolithography, so that a gate layer 52 was formed (see FIG. 2B).

Figure 2C:
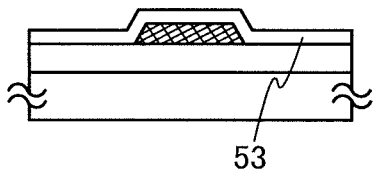
Figure 2D:
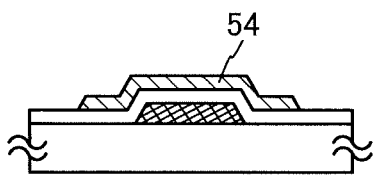
Figure 2E:
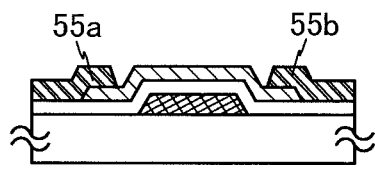
Figure 2F:
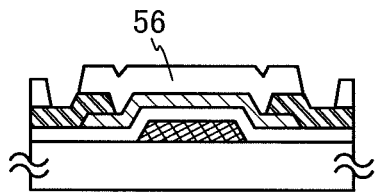

Next, a gate insulating film 53 formed of a 100-nm-thick silicon oxynitride layer was formed by CVD over the base layer 51 and the gate layer 52 (see FIG. 2C).

Then, a 25-nm-thick oxide semiconductor layer was formed by sputtering over the gate insulating film 53. A metal oxide target having a composition ratio of $In_2O_3:Ga_2O_3:ZnO=1:1:2$ [molar ratio] was used for forming the oxide semiconductor layer. In addition, the oxide semiconductor layer was formed under the following conditions: the substrate temperature was 200° C., the internal pressure of the chamber was 0.6 Pa, the direct-current power was 5 kW, and the atmosphere was a mixed atmosphere of oxygen and argon (the oxygen flow rate was 50 sccm and the argon flow rate was 50 sccm). Then, the oxide semiconductor layer was selectively etched by photolithography, so that an oxide semiconductor layer 54 was formed (see FIG. 2D).

Subsequently, heat treatment was performed at 450° C. for one hour in a mixed atmosphere of nitrogen and oxygen (the percentage of nitrogen is 80% and that of oxygen is 20%).

Then, the gate insulating film 53 was selectively etched by photolithography (not illustrated). Note that this etching is a step for forming a contact hole for connecting the gate layer 52 and a conductive layer to be formed.

Next, a stack of a 100-nm-thick titanium layer, a 200-nm-thick aluminum layer, and a 100-nm-thick titanium layer was formed by sputtering over the gate insulating film 53 and the oxide semiconductor layer 54. Then, the stack was selectively etched by photolithography, so that a source layer 55a and a drain layer 55b were formed (see FIG. 2E).

Then, heat treatment was performed at 300° C. for one hour in a nitrogen atmosphere.

Next, a protective insulating layer 56 formed of a 300-nm-thick silicon oxide layer was formed over the gate insulating film 53, the oxide semiconductor layer 54, the source layer 55a, and the drain layer 55b. Then, the protective insulating layer 56 was selectively etched by photolithography (see FIG. 2F). Note that this etching is a step for forming a contact hole for connecting the gate layer, the source layer, and the drain layer and the conductive layer to be formed.

Figure 2G:
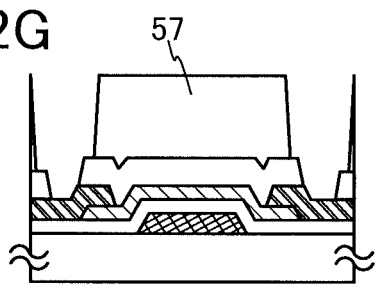
Figure 2H:
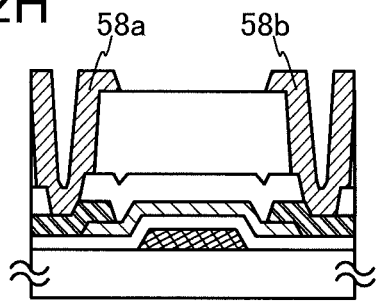

Next, a 1.5-µm-thick acrylic layer was applied over the protective insulating layer 56 and selectively exposed to light, so that a planarization insulating layer 57 was formed (see FIG. 2G). Then, the planarization insulating layer 57 formed of the acrylic layer was baked with heat treatment at 250° C. for one hour in a nitrogen atmosphere.

Subsequently, a 200-nm-thick titanium layer was formed by sputtering over the planarization insulating layer 57. Then, the titanium layer was selectively etched by photolithography, thereby forming a conductive layer (not illustrated) connected to the gate layer 52, a conductive layer 58a connected to the source layer 55a, and a conductive layer 58b connected to the drain layer 55b (see FIG. 2H).

Next, heat treatment was performed at 250° C. for one hour in a nitrogen atmosphere.

Through the above steps, the transistor used for the measurement was formed.

Next, a method for calculating the value of off-state current by using a circuit for evaluating characteristics, used in the measurement, will be described below.

Figure 3A:
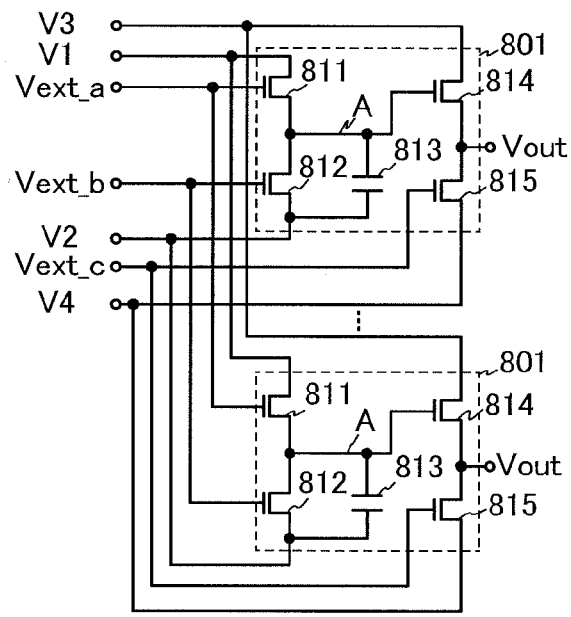
FIGS. 3A to 3C are diagrams for explaining a method for measuring off-state current of a transistor.
Figure 3B:
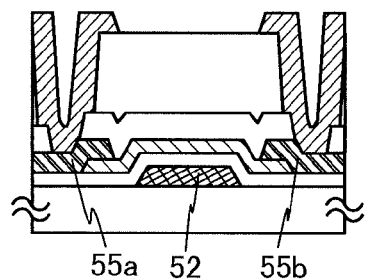
Figure 3C:
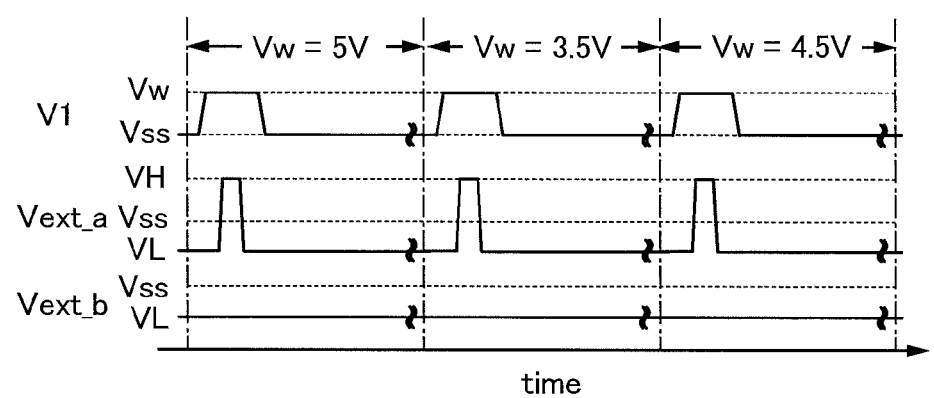

Current measurement using a circuit for evaluating characteristics will be described with reference to FIGS. 3A to 3C. FIGS. 3A to 3C are diagrams for explaining a circuit for evaluating characteristics.

First, a configuration of a circuit for evaluating characteristics is described with reference to FIG. 3A. FIG. 3A is a circuit diagram illustrating the configuration of the circuit for evaluating characteristics.

The circuit for evaluating characteristics illustrated in FIG. 3A includes a plurality of measurement systems 801. The plurality of measurement systems 801 are connected in parallel with each other. Here, eight measurement systems 801 are connected in parallel with each other. By using the plurality of measurement systems 801, a plurality of leakage currents can be measured at the same time.

The measurement system 801 includes a transistor 811, a transistor 812, a capacitor 813, a transistor 814, and a transistor 815.

The transistors 811, 812, 814, and 815 are n-channel field effect transistors.

A voltage V1 is input to one of a source and a drain of the transistor 811. A voltage Vext_a is input to a gate of the transistor 811. The transistor 811 is a transistor for injecting charge.

One of a source and a drain of the transistor 812 is connected to the other of the source and the drain of the transistor 811. A voltage V2 is input to the other of the source and the drain of the transistor 812. A voltage Vext_b is input to a gate of the transistor 812. The transistor 812 is a transistor for evaluating leakage current. Note that "leakage current" in this embodiment refers to a leakage current including an off-state current of the transistor.

One electrode of the capacitor 813 is connected to the other of the source and the drain of the transistor 811. The voltage V2 is input to the other electrode of the capacitor 813. Here, the voltage V2 is 0 V.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, one of the source and the drain of the transistor 812, and one electrode of the capacitor 813 are connected to each other is referred to as a node A. Here, the voltage V3 is 5 V.

One of a source and a drain of the transistor 815 is connected to the other of the source and the drain of the transistor 814. A voltage V4 is input to the other of the source and the drain of the transistor 815. A voltage Vext_c is input to a gate of the transistor 815. Here, the voltage Vext_c is 0.5 V.

The measurement system 801 outputs a voltage at a portion where the other of the source and the drain of the transistor 814 is connected to one of the source and the drain of the transistor 815, as an output voltage Vout.

Here, as the transistor 811, a transistor that is formed by the formation method described with reference to FIGS. 2A to 2H and has a channel length L of 10 µm and a channel width W of 10 µm is used.

As the transistors 814 and 815, a transistor that is formed by the formation method described with reference to FIGS. 2A to 2H and has a channel length L of 3 µm and a channel width W of 100 µm is used.

At least the transistor 812 includes a 1-µm-wide offset region in which the gate layer 52 does not overlap with the source layer 55a and the drain layer 55b as illustrated in FIG. 3B. By providing the offset region, parasitic capacitance can be reduced. Further, as the transistor 812, six samples (SMP) of transistors having different channel lengths L and channel widths W are used (see Table 1).

TABLE 1

|  | L[µm] | W[µm] |
|---|---|---|
| SMP1 | 1.5 | $1 \times 10^5$ |
| SMP2 | 3 | $1 \times 10^5$ |
| SMP3 | 10 | $1 \times 10^5$ |
| SMP4 | 1.5 | $1 \times 10^6$ |
| SMP5 | 3 | $1 \times 10^6$ |
| SMP6 | 10 | $1 \times 10^6$ |

The transistor for injecting charge and the transistor for evaluating leakage current are separately provided as illustrated in FIG. 3A, so that the transistor for evaluating leakage current can be always kept off while electric charge is injected.

In addition, the transistor for injecting charge and the transistor for evaluating leakage current are separately provided, whereby each transistor can have an appropriate size. When the channel width W of the transistor for evaluating leakage current is made larger than that of the transistor for injecting charge, leakage current components of the circuit for evaluating characteristics other than the leakage current of the transistor for evaluating leakage current can be made relatively small. As a result, the leakage current of the transistor for evaluating leakage current can be measured with high accuracy. In addition, since the transistor for evaluating leakage current does not need to be turned on at the time of charge injection, the measurement is not adversely affected by variation in the voltage of the node A, which is caused when part of electric charge in the channel region flows into the node A.

Next, a method for measuring a leakage current of the circuit for evaluating characteristics illustrated in FIG. 3A will be described with reference to FIG. 3C. FIG. 3C is a timing chart for explaining the method for measuring a leakage current with use of the circuit for evaluating characteristics illustrated in FIG. 3A.

In the method for measuring the leakage current with the circuit for evaluating characteristics illustrated in FIG. 3A, a write period and a hold period are provided. The operation in each period is described below.

In the write period, a voltage VL (−3 V) with which the transistor 812 is turned off is input as the voltage Vext_b. Moreover, a write voltage Vw is input as the voltage V1, and then, a voltage VH (5 V) with which the transistor 811 is turned on is input as the voltage Vext_a for a given period. Thus, electric charge is accumulated in the node A, and the voltage of the node A becomes equivalent to the write voltage Vw. Then, the voltage VL with which the transistor 811 is turned off is input as the voltage Vext_a. After that, a voltage VSS (0 V) is input as the voltage V1.

In the hold period, the amount of change in the voltage of the node A, caused by change in the amount of the electric charge held in the node A, is measured. From the amount of change in the voltage, the value of the current flowing between the source and the drain of the transistor 812 can be calculated. In the above manner, electric charge can be accumulated in the node A, and the amount of change in the voltage of the node A can be measured.

Accumulation of electric charge in the node A and measurement of the amount of change in the voltage of the node A (also referred to as an accumulation and measurement operation) are repeatedly performed. First, a first accumulation and measurement operation is repeated 15 times. In the first accumulation and measurement operation, a voltage of 5 V is input as the write voltage Vw in the write period and retained for 1 hour in the hold period. Next, a second accumulation and measurement operation is repeated twice. In the second accumulation and measurement operation, a voltage of 3.5 V is input as the write voltage Vw in the write period and retained for 50 hours in the hold period. Next, a third accumulation and measurement operation is performed once. In the third accumulation and measurement operation, a voltage of 4.5 V is input as the write voltage Vw in the write period and retained for 10 hours in the hold period. By repeating the accumulation and measurement operation, the measured current value can be confirmed to be the value in the steady state. In other words, the transient current (a current component that decreases over time after the measurement starts) can be removed from a current $I_A$ flowing through the node A. Consequently, the leakage current can be measured with higher accuracy.

In general, a voltage $V_A$ of the node A is expressed as a function of the output voltage Vout by Formula 1.

$$V_A = F(Vout) \tag{1}$$

Electric charge $Q_A$ of the node A is expressed by Formula 2, using the voltage $V_A$ of the node A, capacitance $C_A$ connected to the node A, and a constant (const). Here, the capacitance $C_A$ connected to the node A is the sum of the capacitance of the capacitor 813 and a capacitance other than that of the capacitor 813.

$$Q_A = C_A V_A + \text{const} \tag{2}$$

Since the current $I_A$ of the node A is the time differential of electric charge flowing into the node A (or electric charge flowing from the node A), the current $I_A$ of the node A is expressed by Formula 3.

$$I_A = \frac{\Delta Q_A}{\Delta t} = \frac{C_A \cdot \Delta F(Vout)}{\Delta t} \tag{3}$$

Here, Δt is about 54000 sec. As above, the current $I_A$ of the node A, which is the leakage current, can be calculated with the capacitance $C_A$ connected to the node A and the output voltage Vout, so that the leakage current of the circuit for evaluating characteristics can be obtained.

Next, the results of measuring the output voltage by the measurement method using the above circuit for evaluating characteristics and the value of the leakage current of the circuit for evaluating characteristics, which is calculated from the measurement results, will be described with reference to FIGS. 4A and 4B.

Figure 4A:
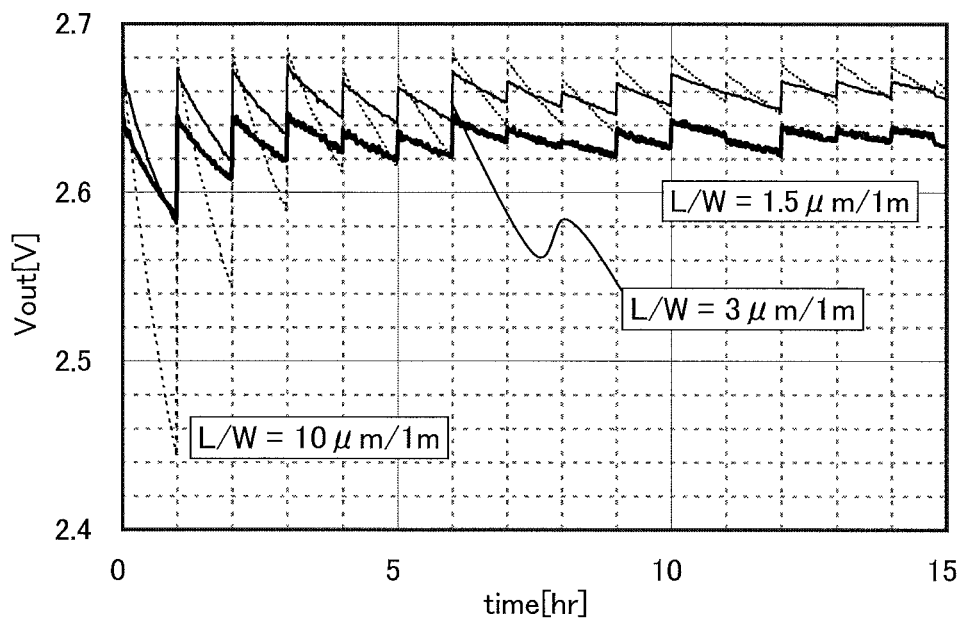
FIGS. 4A and 4B show characteristics of transistors.
Figure 4B:
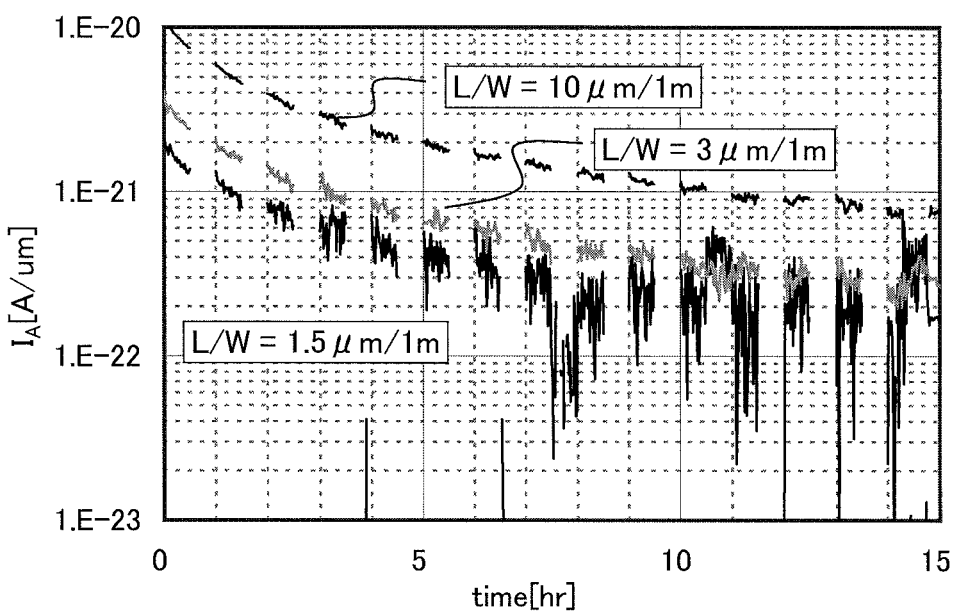

As an example, FIG. 4A shows the relation between the elapsed time Time of the above measurement (the first accumulation and measurement operation) of the transistors SMP4, SMP5, and SMP6 and the output voltage Vout. FIG. 4B shows the relation between the elapsed time Time of the above measurement and the current $I_A$ calculated by the measurement. It is found that the output voltage Vout varies after the measurement starts and it takes 10 hours or longer to reach a steady state.

Figure 5:
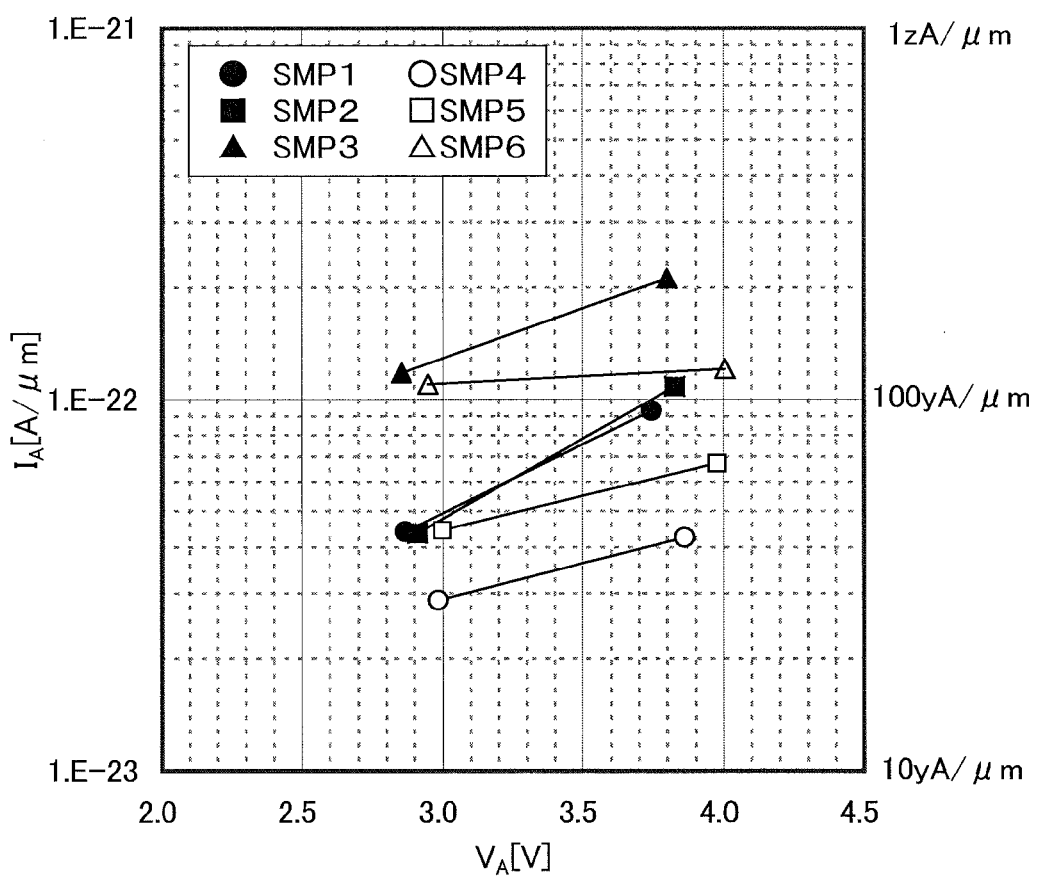
FIG. 5 shows characteristics of transistors.

FIG. 5 shows the relation between the voltage of the node A in SMP1 to SMP6 and the leakage current estimated by the above measurement. In SMP4 in FIG. 5, for example, when the voltage of the node A is 3.0 V, the leakage current is 28 yA/μm. Since the leakage current includes the off-state current of the transistor 812, the off-state current of the transistor 812 can be considered to be 28 yA/μm or less.

Figure 6:
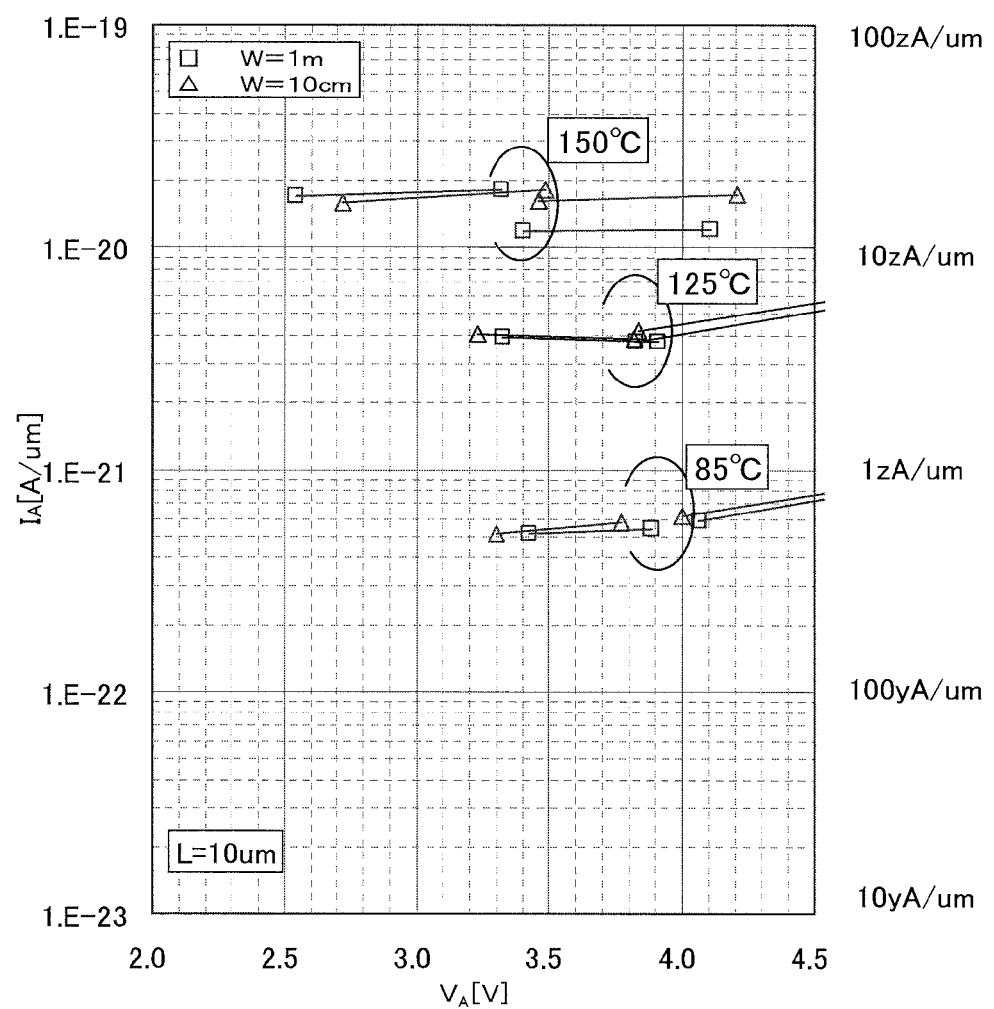
FIG. 6 shows characteristics of transistors.
Figure 7:
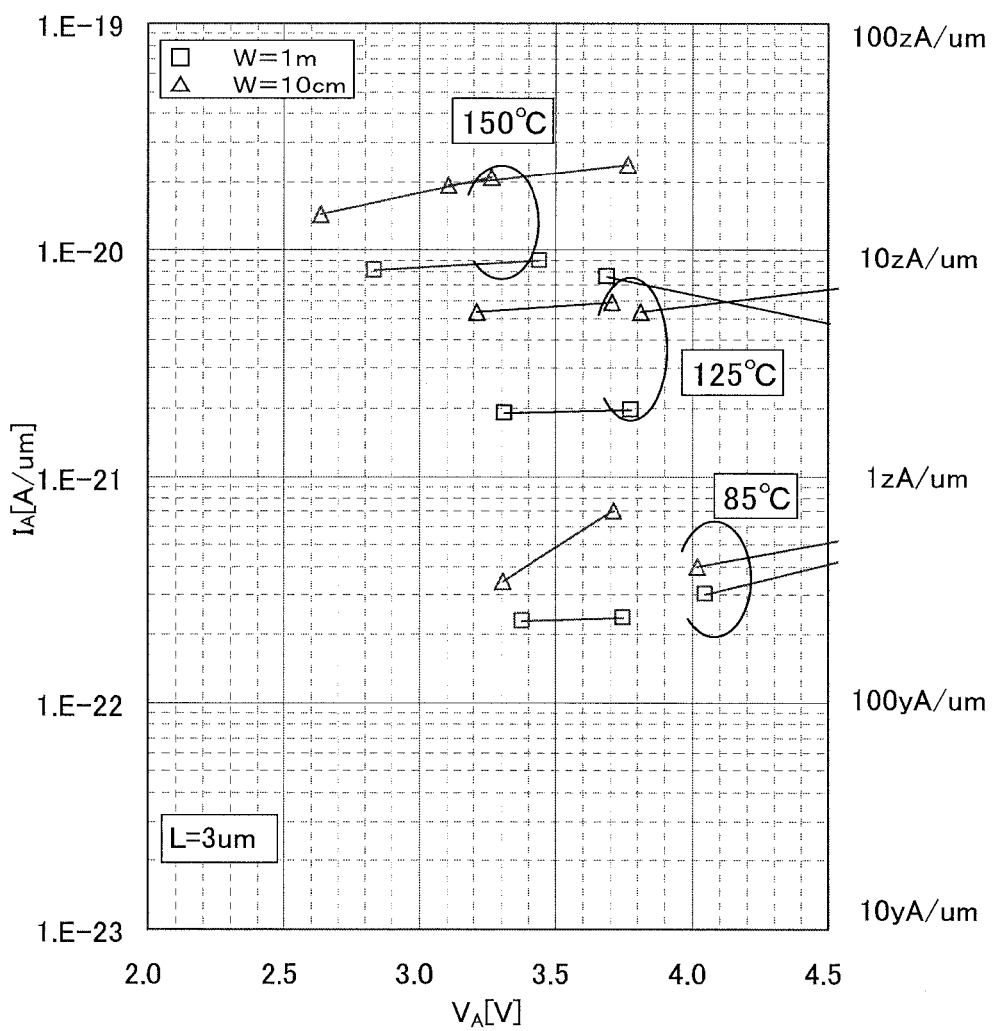
FIG. 7 shows characteristics of transistors.
Figure 8:
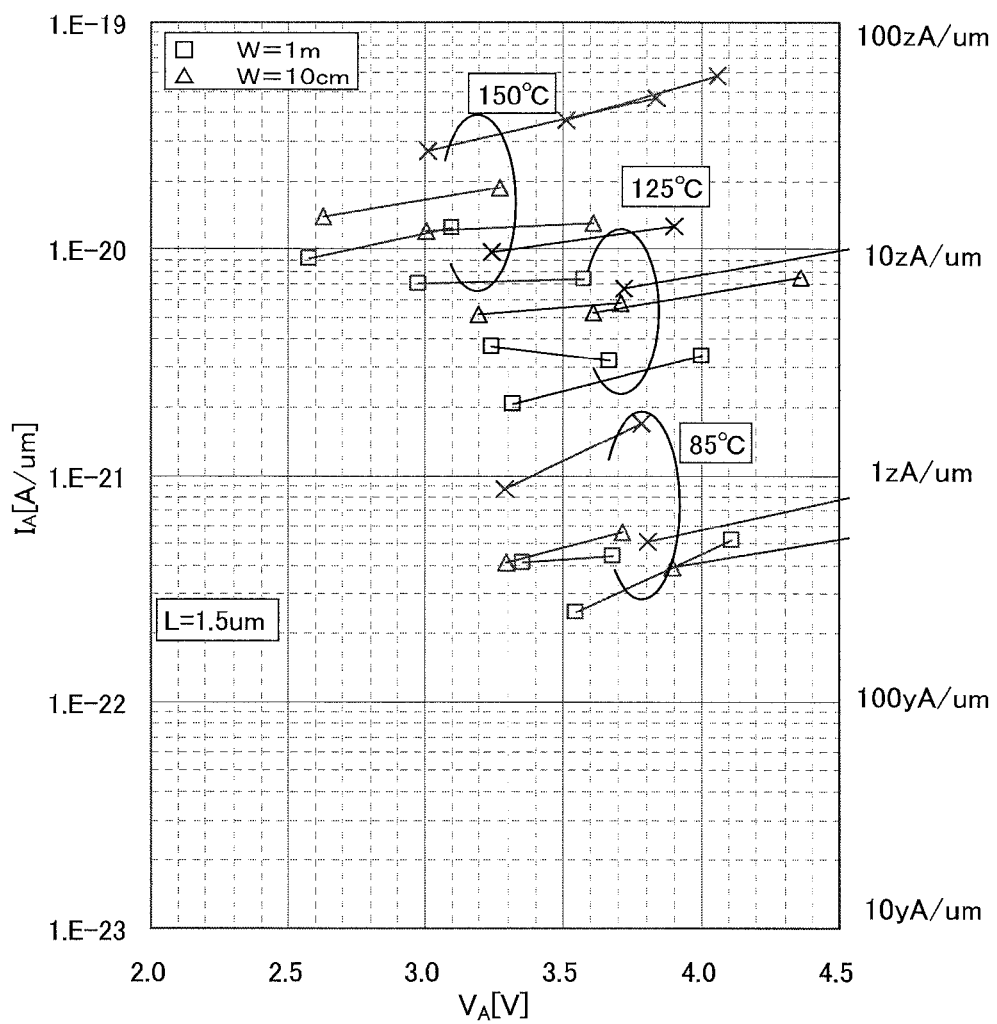
FIG. 8 shows characteristics of transistors.

FIG. 6, FIG. 7, and FIG. 8 each show the relation between the voltage of the node A in SMP1 to SMP6 at 85° C., 125° C., and 150° C. and the leakage current estimated by the above measurement. As shown in FIGS. 6 to 8, the leakage current is 100 zA/μm or less even at 150° C.

As described above, the leakage current is sufficiently low in the circuit for evaluating characteristics, including the transistor whose channel region is formed with an oxide semiconductor, which means that the off-state current of the transistor is sufficiently low. In addition, the off-state current of the transistor is sufficiently low even when the temperature rises.

<Specific Example of Layout>

Next, a specific example of the layout of the semiconductor device in FIG. 1A will be described with reference to FIGS. 9A and 9B.

Figure 9A:
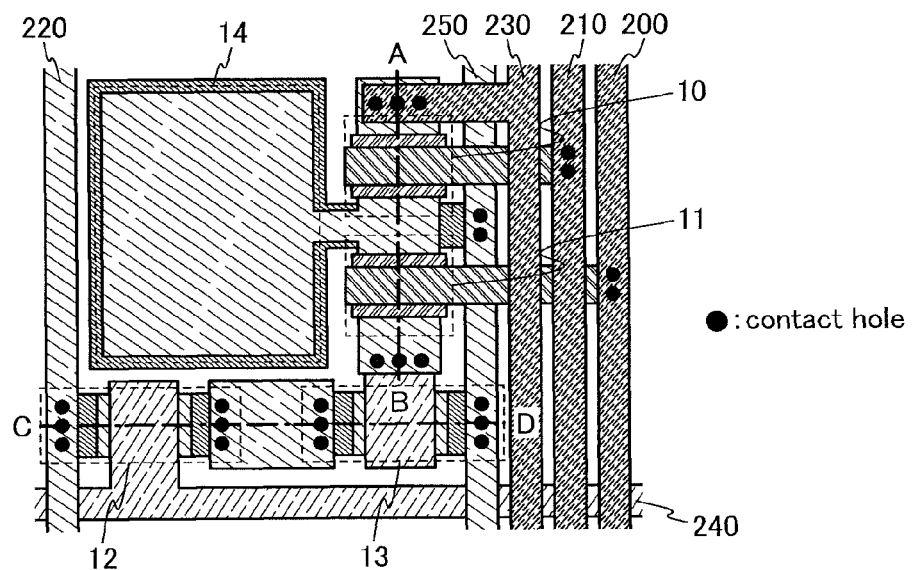
FIGS. 9A and 9B are a top view and a cross-sectional view illustrating a specific example of a layout of a semiconductor device.

FIG. 9A is a top view illustrating a specific example of the layout of the semiconductor device in FIG. 1A. FIG. 9B is a cross-sectional view along A-B and C-D in FIG. 9A.

Figure 9B:
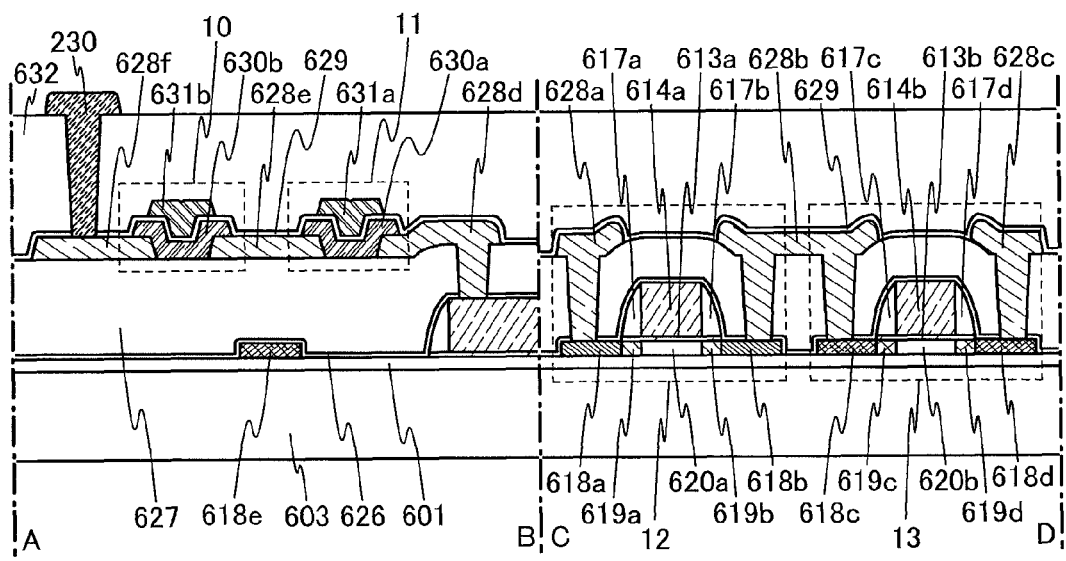

The semiconductor device in FIGS. 9A and 9B includes transistors 12 and 13 in each of which a channel region is formed using single crystal silicon provided over a substrate 603 with an insulating layer 601 placed therebetween, transistors 10 and 11 in each of which a channel region is formed using an oxide semiconductor provided over an insulating layer 627 that covers the transistors 12 and 13, and a capacitor 14.

Specifically, the transistor 10 includes conductive layers 628e and 628f provided over the insulating layer 627; an oxide semiconductor layer 630b provided over the insulating layer 627, one edge of the conductive layer 628f, and one edge of the conductive layer 628e; an insulating layer 629 provided over the conductive layers 628e and 628f and the oxide semiconductor layer 630b; and a conductive layer 631b provided over the oxide semiconductor layer 630b with the insulating layer 629 placed therebetween. Note that in the transistor 10, the conductive layer 631b functions as a gate, the insulating layer 629 functions as a gate insulating film, and the conductive layers 628e and 628f function as a source and a drain.

Similarly, the transistor 11 includes a conductive layer 628d and the conductive layer 628e provided over the insulating layer 627; an oxide semiconductor layer 630a provided over the insulating layer 627, one edge of the conductive layer 628d, and the other edge of the conductive layer 628e; the insulating layer 629 provided over the conductive layers 628d and 628e and the oxide semiconductor layer 630a; and a conductive layer 631a provided over the oxide semiconductor layer 630a with the insulating layer 629 placed therebetween. Note that in the transistor 11, the conductive layer 631a functions as a gate, the insulating layer 629 functions as a gate insulating film, and the conductive layers 628d and 628e function as a source and a drain.

The transistor 12 includes a pair of high-concentration impurity regions 618a and 618b, a pair of low-concentration impurity regions 619a and 619b, and a channel region 620a that are framed in a single crystal silicon layer provided over the insulating layer 601; an insulating layer 613a provided over the pair of low-concentration impurity regions 619a and 619b and the channel region 620a; a conductive layer 614a provided over the channel region 620a with the insulating layer 613a placed therebetween; sidewalls 617a and 617b provided over the pair of low-concentration impurity regions 619a and 619b with the insulating layer 613a placed therebetween; and a pair of conductive layers 628a and 628b electrically connected to the pair of high-concentration impurity regions 618a and 618b. Note that in the transistor 12, the conductive layer 614a functions as a gate, the insulating layer 613a functions as a gate insulating film, and the conductive layers 628a and 628b function as a source and a drain.

Similarly, the transistor 13 includes a pair of high-concentration impurity regions 618c and 618d, a pair of low-concentration impurity regions 619c and 619d, and a channel region 620b that are formed in the single crystal silicon layer provided over the insulating layer 601; an insulating layer 613b provided over the pair of low-concentration impurity regions 619c and 619d and the channel region 620b; a conductive layer 614b provided over the channel region 620b with the insulating layer 613b placed therebetween; sidewalls 617c and 617d provided over the pair of low-concentration impurity regions 619c and 619d with the insulating layer 613b placed therebetween; and a pair of conductive layers 628b and 628c electrically connected to the pair of high-concentration impurity regions 618c and 618d. Note that in the transistor 13, the conductive layer 614b functions as a gate, the insulating layer 613b functions as a gate insulating film, and the conductive layers 628b and 628c function as a source and a drain.

The capacitor 14 includes a high-concentration impurity region 618e formed in single crystal silicon, an insulating layer 626 and the insulating layer 627 provided over the high-concentration impurity region 618e, and the conductive layer 628e provided over the insulating layer 627. Note that in the capacitor 14, the conductive layer 628e functions as one electrode, the insulating layers 626 and 627 function as a dielectric, and the high-concentration impurity region 618e functions as the other electrode.

Note that the semiconductor device in FIG. 1A needs to be designed so that the decrease in the potential of the node A to which one electrode of the capacitor 14 is electrically connected is further suppressed as compared to at least the decrease in the potential of the node B to which the gate of the transistor 13 is electrically connected. In view of this point, in the capacitor 14 illustrated in FIGS. 9A and 9B, the insulating layer 627 in addition to the insulating layer 626, which functions as the gate insulating film in the transistors 12 and 13, are used as a dielectric. In other words, with the use of another insulating layer in addition to the gate insulating film in the transistor 13 as the dielectric of the capacitor 14, the decrease in the potential of the node A due to leakage current generated between a pair of electrodes of the capacitor 14 can be further suppressed as compared to the decrease in the potential of the node B due to gate leakage current of the transistor 13.

The conductive layer 628f is connected to a conductive layer 230 functioning as the data line 23 in a contact hole provided in the insulating layer 629 and an insulating layer 632. The conductive layer 631b is connected to a conductive layer 210 functioning as the signal line 21 in a contact hole provided in the insulating layer 632. The conductive layer 631a is connected to a conductive layer 200 functioning as the signal line 20 in a contact hole provided in the insulating layer 632. The high-concentration impurity region 618e is connected to a conductive layer 250 functioning as the fixed potential line 25 in a contact hole provided in the insulating layers 626 and 627.

The conductive layer 628a is part of a conductive layer 220 functioning as the bit line 22. The conductive layer 614a is part of a conductive layer 240 functioning as the word line 24. The conductive layer 628c is part of the conductive layer 250 functioning as the fixed potential line 25.

Examples of a method for forming a single crystal silicon layer over the substrate 603 are UNIBOND (registered trademark) typified by Smart Cut (registered trademark), epitaxial layer transfer (ELTRAN) (registered trademark), a dielectric separation method, and a plasma assisted chemical etching (PACE) method.

<Variation>

The above semiconductor device is one embodiment of the present invention, and a semiconductor device part of which is different from the semiconductor device is included in the present invention.

Figure 10:
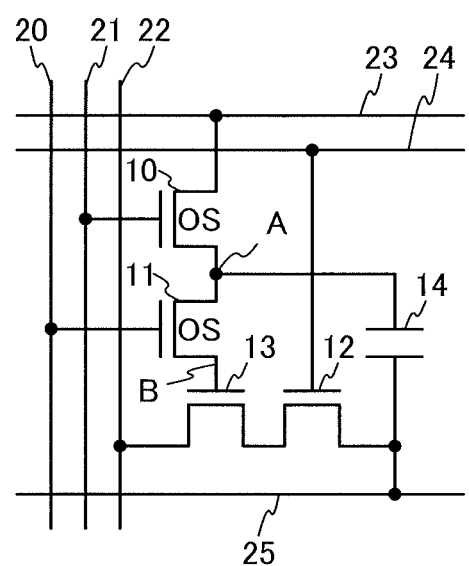
FIG. 10 is a circuit diagram illustrating a variation of a semiconductor device.

For example, the semiconductor device can have a structure illustrated in FIG. 10. Simply put, in the semiconductor device in FIG. 10, the transistors 12 and 13 in FIG. 1A are replaced with each other. Specifically, the semiconductor device in FIG. 10 differs from the semiconductor device in FIG. 1A in that one of the source and the drain of the transistor 13 is electrically connected to the bit line 22, one of the source and the drain of the transistor 12 is electrically connected to the other of the source and the drain of the transistor 13, and the other of the source and the drain of the transistor 12 is electrically connected to the fixed potential line 25.

Note that the semiconductor device in FIG. 10 can be operated in the same manner as the operation example in FIG. 1B.

Figure 11A:
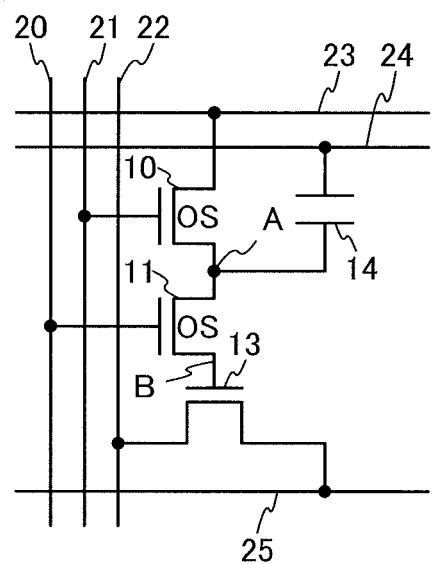
FIG. 11A is a circuit diagram illustrating a variation of a semiconductor device.

Further, the semiconductor device can have a structure illustrated in FIG. 11A. Simply put, the transistor 12 in FIG. 1A is omitted in the semiconductor device in FIG. 11A.

Specifically, the semiconductor device in FIG. 11A differs from the semiconductor device in FIG. 1A in that one of the source and the drain of the transistor 13 is electrically connected to the bit line 22 and the other electrode of the capacitor 14 is electrically connected to the word line 24. The semiconductor device in FIG. 11A is preferable because the number of transistors can be reduced.

Figure 11B:
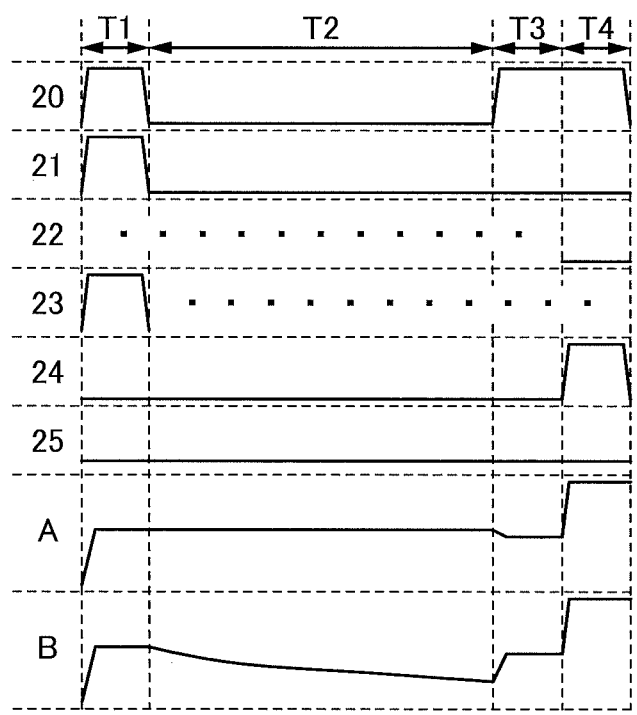
FIG. 11B illustrates an example of operation of the semiconductor device.

Note that the semiconductor device in FIG. 11A is operated in a manner different from those of the semiconductor devices in FIG. 1A and FIG. 10. FIG. 11B illustrates an example of the operation of the semiconductor device in FIG. 11A. In the example of the operation illustrated in FIG. 11B, the operation in the read period T4 is different from that in FIG. 1B. Specifically, in the read period T4, the potential of the signal line 20 is kept at the high-level potential. Accordingly, the potentials of the node A and the node B are further increased by capacitive coupling through the capacitor 14. At that time, the transistor 13 is turned on, and data stored in the semiconductor device can be judged.

The semiconductor device in FIG. 11A needs to be designed so that the transistor 13 is on only in the read period T4 in the operation example illustrated in FIG. 11B. That is, the transistor 13 needs to be kept off while the potential of the node B is increased to the high-level potential in the write period T1 in the operation example in FIG. 11B. In addition, the transistor 13 needs to be kept off while the potential of the node B is increased by capacitive coupling through the capacitor 14 in the read period T4, which occurs even if it remains at the low-level potential in the write period T1. In other words, the threshold voltage of the transistor 13 needs to be higher than the potential difference between the maximum value of the potential supplied to the data line 23 and the potential of the fixed potential line 25, higher than the potential difference between the maximum value and the minimum value of the potential supplied to the word line 24, and lower than the sum of these two potential differences.

FIGS. 9A and 9B illustrate a specific example of the layout of the semiconductor device including both the transistor whose channel region is formed using single crystal silicon and the transistor whose channel region is formed using an oxide semiconductor; alternatively, the semiconductor device can be formed using only transistors whose channel region is formed using an oxide semiconductor. A specific example of the layout of such a semiconductor device will be described with reference to FIGS. 12A and 12B.

Figure 12A:
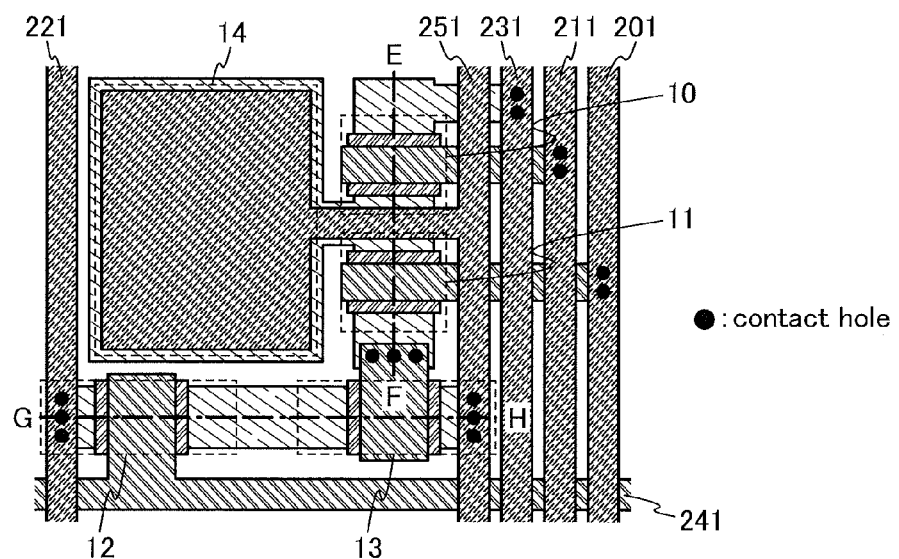
FIGS. 12A and 12B are a top view and a cross-sectional view illustrating a variation of a layout of a semiconductor device.
Figure 12B:
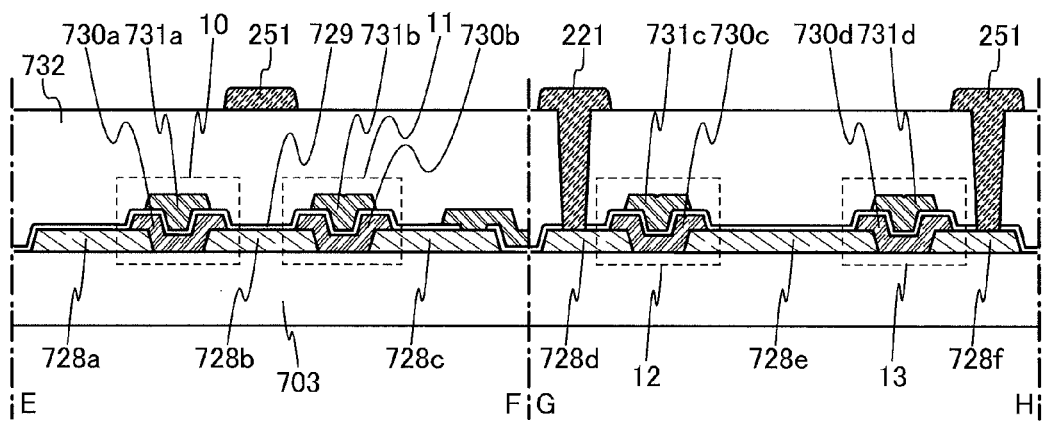

FIG. 12A is a top view illustrating a specific example of the layout of the semiconductor device in FIG. 1A. FIG. 12B is a cross-sectional view along E-F and G-H in FIG. 12A.

The semiconductor device illustrated in FIGS. 12A and 12B includes transistors 10 to 13 in each of which a channel region is formed using an oxide semiconductor provided over a substrate 703, and a capacitor 14.

Specifically, the transistor 10 includes conductive layers 728*a* and 728*b* provided over the substrate 703; an oxide semiconductor layer 730*a* provided over the substrate 703, one edge of the conductive layer 728*a*, and one edge of the conductive layer 728*b*; an insulating layer 729 provided over the conductive layers 728*a* and 728*b* and the oxide semiconductor layer 730*a*; and a conductive layer 731*a* provided over the oxide semiconductor layer 730*a* with the insulating layer 729 placed therebetween. Note that in the transistor 10, the conductive layer 731*a* functions as a gate, the insulating layer 729 functions as a gate insulating film, and the conductive layers 728*a* and 728*b* function as a source and a drain.

The transistor 11 includes the conductive layer 728*b* and a conductive layer 728*c* provided over the substrate 703; an oxide semiconductor layer 730*b* provided over the substrate 703, the other edge of the conductive layer 728*b*, and one edge of the conductive layer 728*c*; the insulating layer 729 provided over the conductive layers 728*b* and 728*c* and the oxide semiconductor layer 730*b*; and a conductive layer 731*b* provided over the oxide semiconductor layer 730*b* with the insulating layer 729 placed therebetween. Note that in the transistor 11, the conductive layer 731*b* functions as a gate, the insulating layer 729 functions as a gate insulating film, and the conductive layers 728*b* and 728*c* function as a source and a drain.

The transistor 12 includes conductive layers 728*d* and 728*e* provided over the substrate 703; an oxide semiconductor layer 730*c* provided over the substrate 703, one edge of the conductive layer 728*d*, and one edge of the conductive layer 728*e*; the insulating layer 729 provided over the conductive layers 728*d* and 728*e* and the oxide semiconductor layer 730*c*; and a conductive layer 731*c* provided over the oxide semiconductor layer 730*c* with the insulating layer 729 placed therebetween. Note that in the transistor 12, the conductive layer 731*c* functions as a gate, the insulating layer 729 functions as a gate insulating film, and the conductive layers 728*d* and 728*e* function as a source and a drain.

The transistor 13 includes the conductive layer 728*e* and a conductive layer 728*f* provided over the substrate 703; an oxide semiconductor layer 730*d* provided over the substrate 703, the other edge of the conductive layer 728*e*, and one edge of the conductive layer 728*f*; the insulating layer 729 provided over the conductive layers 728*e* and 728*f* and the oxide semiconductor layer 730*d*; and a conductive layer 731*d* provided over the oxide semiconductor layer 730*d* with the insulating layer 729 placed therebetween. Note that in the transistor 13, the conductive layer 731*d* functions as a gate, the insulating layer 729 functions as a gate insulating film, and the conductive layers 728*e* and 728*f* function as a source and a drain.

The capacitor 14 includes the conductive layer 728*b*, the insulating layer 729 and an insulating layer 732 provided over the conductive layer 728*b*, and part of a conductive layer 251 that is provided over the insulating layer 732 and functions as the fixed potential line 25. Note that in the capacitor 14, the conductive layer 728*b* functions as one electrode, the insulating layers 729 and 732 function as a dielectric, and the part of the conductive layer 251 functions as the other electrode.

Note that the semiconductor device in FIG. 1A needs to be designed so that the decrease in the potential of the node A to which one electrode of the capacitor 14 is electrically connected is further suppressed as compared to at least the decrease in the potential of the node B to which the gate of the transistor 13 is electrically connected. In view of this point, in the capacitor 14 illustrated in FIGS. 12A and 12B, the insulating layer 732 in addition to the insulating layer 729, which functions as the gate insulating film in the transistors 10 to 13, are used as a dielectric. In other words, with the use of another insulating layer in addition to the gate insulating film in the transistor 13 as the dielectric of the capacitor 14, the decrease in the potential of the node A due to leakage current generated between a pair of electrodes of the capacitor 14 can be further suppressed as compared to the decrease in the potential of the node B due to gate leakage current of the transistor 13.

The conductive layer 728*a* is connected to a conductive layer 231 functioning as the data line 23 in a contact hole provided in the insulating layers 729 and 732. The conductive layer 731*a* is connected to a conductive layer 211 functioning as the signal line 21 in a contact hole provided in the insulating layer 732. The conductive layer 731*b* is connected to a conductive layer 201 functioning as the signal line 20 in a contact hole provided in the insulating layer 732. The conductive layer 728c is connected to the conductive layer 731d in a contact hole provided in the insulating layer 729. The conductive layer 728d is connected to a conductive layer 221 functioning as the bit line 22 in a contact hole provided in the insulating layers 729 and 732. The conductive layer 728f is connected to the conductive layer 251 functioning as the fixed potential line 25 in a contact hole provided in the insulating layers 729 and 732.

As illustrated in FIGS. 12A and 12B, the semiconductor device is formed using the transistors whose channel regions are formed using an oxide semiconductor, so that cost reduction and improvement in yield due to the reduction in the number of formation steps can be realized.

Embodiment 2

In this embodiment, an oxide including a crystal with c-axis alignment, which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such a crystal is also referred to as a c-axis aligned crystal (CAAC).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane).

Figure 13A:
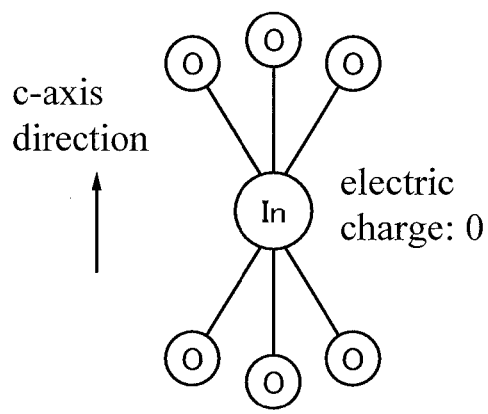
FIGS. 13A to 13E each illustrate a crystal structure of an oxide material.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
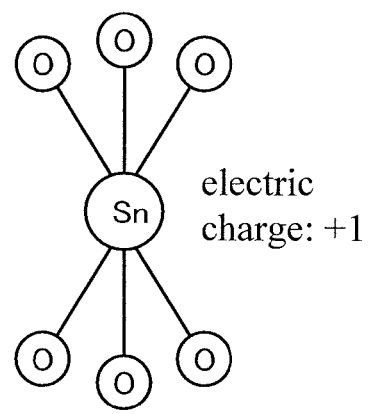
Figure 13B:
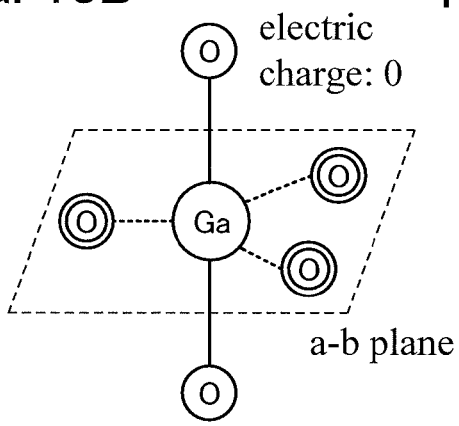

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
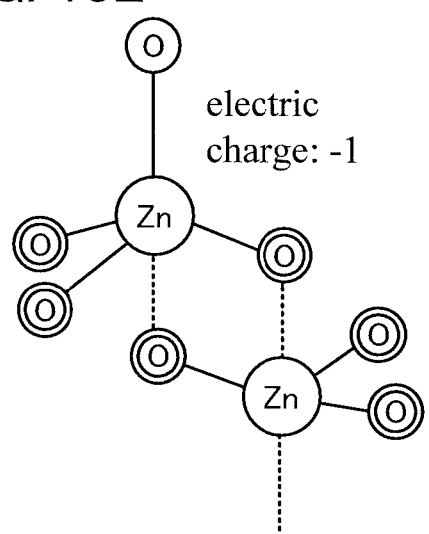
Figure 13C:
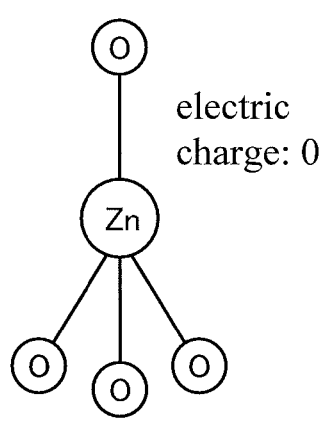

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the small group illustrated in FIG. 13D, electric charge is +1.

FIG. 13E illustrates a small group including two Zn atoms. In FIG. 13E, one tetracoordinate O atom exists in each of an upper half and a lower half. In the small group illustrated in FIG. 13E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the 0 atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 14A illustrates a model of a medium group included in a layered structure of an In—Sn—Zn—O-based material. FIG. 14B illustrates a large group including three medium groups. FIG. 14C illustrates an atomic arrangement in the case where the layered structure in FIG. 14B is observed from the c-axis direction.

In FIG. 14A, for simplicity, a tricoordinate O atom is omitted and a tetracoordinate O atom is shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an oxide of four metal elements, such as an In—Sn—Ga—Zn—O-based material; an oxide of three metal elements, such as an In—Ga—Zn—O-based material (also referred to as IGZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; an oxide of two metal elements, such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material.

Figure 15A:
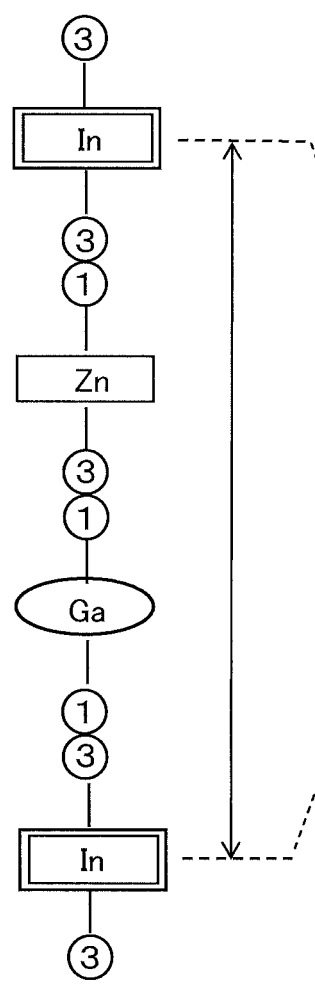
FIGS. 15A to 15C illustrate a crystal structure of an oxide material.

As an example, FIG. 15A illustrates a model of a medium group included in a layered structure of an In—Ga—Zn—O-based material.

In the medium group included in the layered structure of the In—Ga—Zn—O-based material in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 15B:
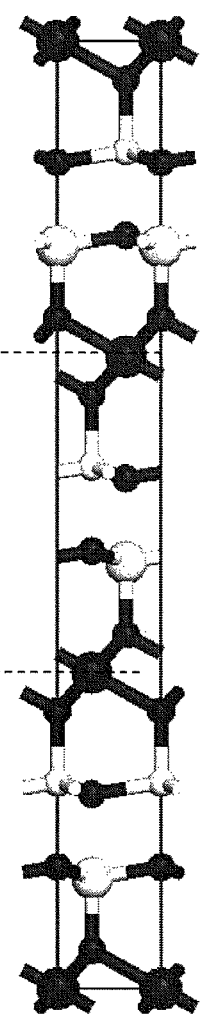
Figure 15C:
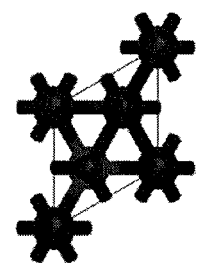

FIG. 15B illustrates a large group including three medium groups. FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 15A but also a medium group in which the arrangement of the In atom, the Ga atom, and the Zn atom is different from that in FIG. 15A.

Embodiment 3

In this embodiment, the field-effect mobility of a transistor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \tag{A2}$$

Here, E represents the height of the potential barrier, k represents the Boltzmann constant, and T represents the absolute temperature. When the potential barrier is assumed to be attributed to a defect, the height E of the potential barrier is expressed as the following formula according to the Levinson model.

$$E = \frac{e^2 N^2}{8\varepsilon n} = \frac{e^3 N^2 t}{8\varepsilon C_{ox} V_g} \tag{A3}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region is expressed as the following formula.

$$I_d = \frac{W \mu V_g V_d C_{ox}}{L} \exp\left(-\frac{E}{kT}\right) \tag{A4}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT \varepsilon C_{ox} V_g} \tag{A5}$$

The right side of Formula (A5) is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, $\mu_0$ can be calculated to be 120 cm$^2$/Vs from Formula (A2) and Formula (A3). The measured mobility of an In—Sn—Zn oxide including a defect is approximately 40 cm$^2$/Vs. However, assuming that no defect exists inside an oxide semiconductor and at the interface between the oxide semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film adversely affects the transport properties of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B}\exp\left(-\frac{x}{l}\right) \tag{A6}$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of Formula (A6) is increased and accordingly the mobility $\mu_1$ is decreased.

Figure 16:
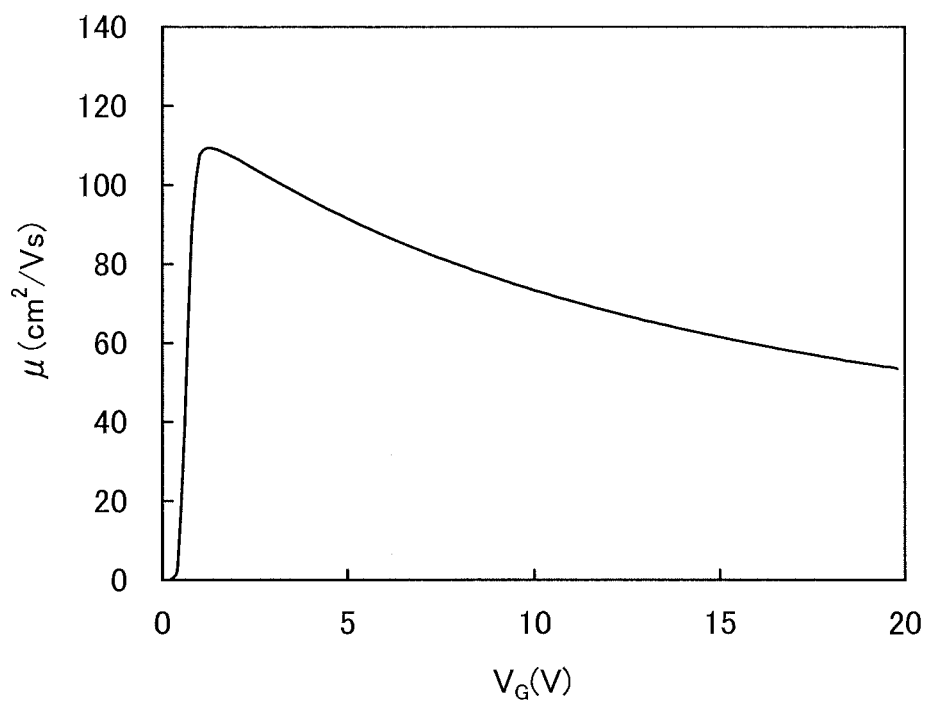
FIG. 16 shows gate voltage dependence of mobility obtained by calculation.

FIG. 16 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of more than 100 cm$^2$/Vs at a gate voltage that is a little over 1 V, and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 1103a and a semiconductor region 1103c that have n$^+$-type conductivity in an oxide semiconductor layer. The resistivity of the semiconductor regions 1103a and 1103c is $2 \times 10^{-3}$ Ωcm.

The transistor in FIG. 20A is formed over a base insulating layer 1101 and an embedded insulator 1102 that is embedded in the base insulating layer 1101 and formed of aluminum oxide. The transistor includes the semiconductor region 1103a, the semiconductor region 1103c, an intrinsic semiconductor region 1103b that is placed between the semiconductor regions 1103a and 1103c and serves as a channel formation region, and a gate electrode 1105. The width of the gate electrode 1105 is 33 nm.

A gate insulating film 1104 is formed between the gate electrode 1105 and the semiconductor region 1103b. A sidewall insulating layer 1106a and a sidewall insulating layer 1106b are formed on both side surfaces of the gate electrode 1105, and an insulating layer 1107 is formed over the gate electrode 1105 so as to prevent a short circuit between the gate electrode 1105 and another wiring. The sidewall insulating layer has a width of 5 nm. A source layer 1108a and a drain layer 1108b are provided in contact with the semiconductor region 1103a and the semiconductor region 1103c, respectively. Note that the channel width of this transistor is 40 nm.

The transistor in FIG. 20B is the same as the transistor in FIG. 20A in that it is formed over the base insulating layer 1101 and the embedded insulator 1102 formed of aluminum oxide and that it includes the semiconductor region 1103a, the semiconductor region 1103c, the intrinsic semiconductor region 1103b provided therebetween, the gate electrode 1105 having a width of 33 nm, the gate insulating film 1104, the sidewall insulating layer 1106a, the sidewall insulating layer 1106b, the insulating layer 1107, the source layer 1108a, and the drain layer 1108b.

The difference between the transistor in FIG. 20A and the transistor in FIG. 20B is the conductivity type of semiconductor regions under the sidewall insulating layers 1106a and 1106b. In the transistor in FIG. 20A, the semiconductor regions under the sidewall insulating layer 1106a and the sidewall insulating layer 1106b are part of the semiconductor region 1103a having n$^+$-type conductivity and part of the semiconductor region 1103c having n$^+$-type conductivity, whereas in the transistor in FIG. 20B, the semiconductor regions under the sidewall insulating layer 1106a and the sidewall insulating layer 1106b are part of the intrinsic semiconductor region 1103b. In other words, in the semiconductor layer of FIG. 20B, a region having a width of $L_{off}$ which overlaps with neither the semiconductor region 1103a (the semiconductor region 1103c) nor the gate electrode 1105 is provided. This region is called an offset region, and the width $L_{off}$ is called an offset length. As is seen from the drawing, the offset length is equal to the width of the sidewall insulating layer 1106a (the sidewall insulating layer 1106b).

Figure 17A:
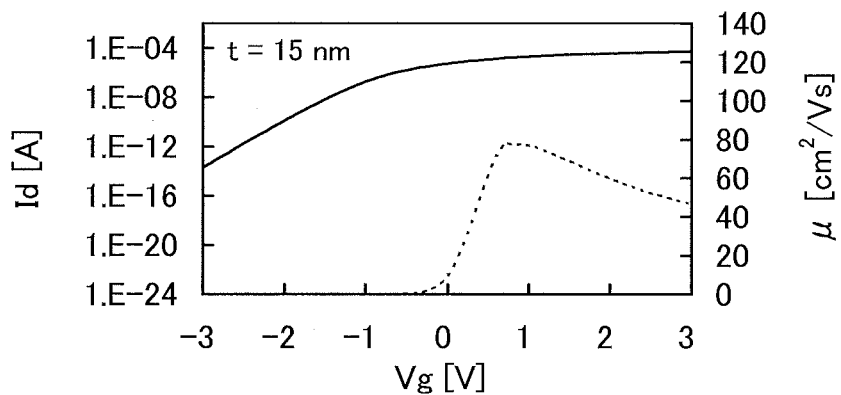
FIGS. 17A to 17C each show gate voltage dependence of drain current and mobility, obtained by calculation.
Figure 17B:
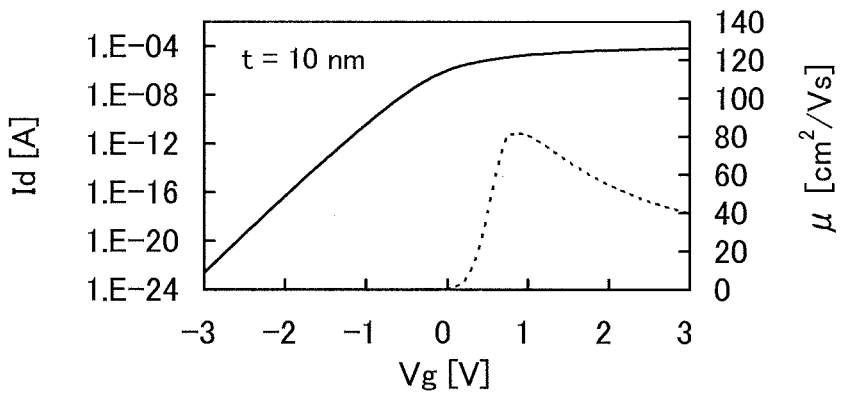
Figure 17C:
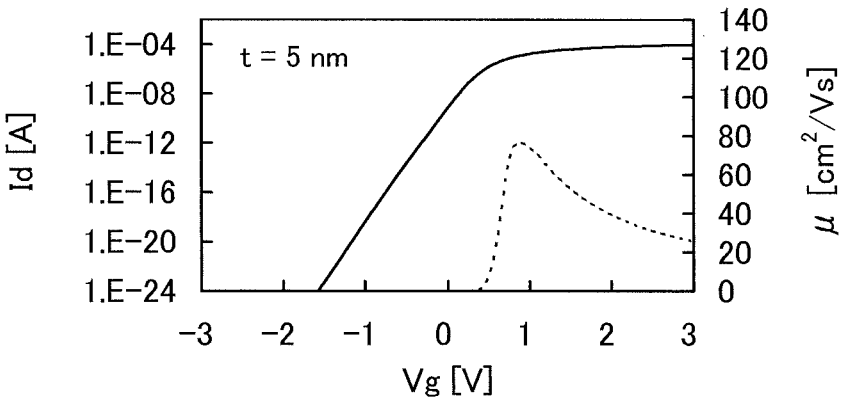

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility (μ, a dotted line) of the transistor having the structure illustrated in FIG. 20A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in the peak value of the mobility μ and the drain current $I_d$ in an on state (the on-state current). The graphs show that the drain current exceeds 10 μA, which is required in a memory element and the like, at a gate voltage of around 1 V.

Figure 18A:
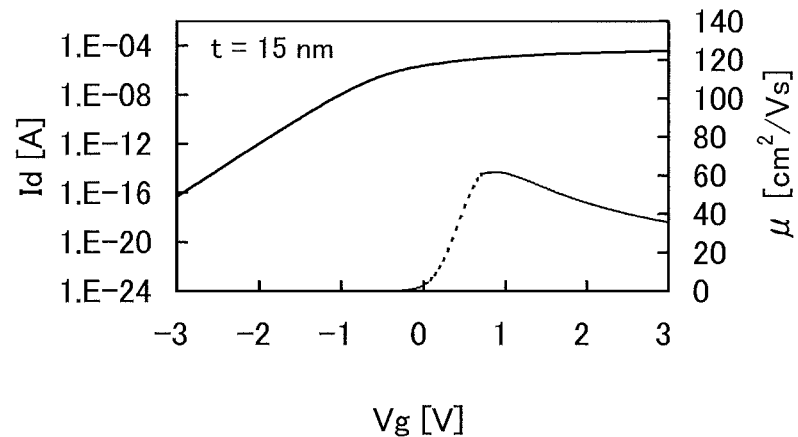
FIGS. 18A to 18C each show gate voltage dependence of drain current and mobility, obtained by calculation.
Figure 18B:
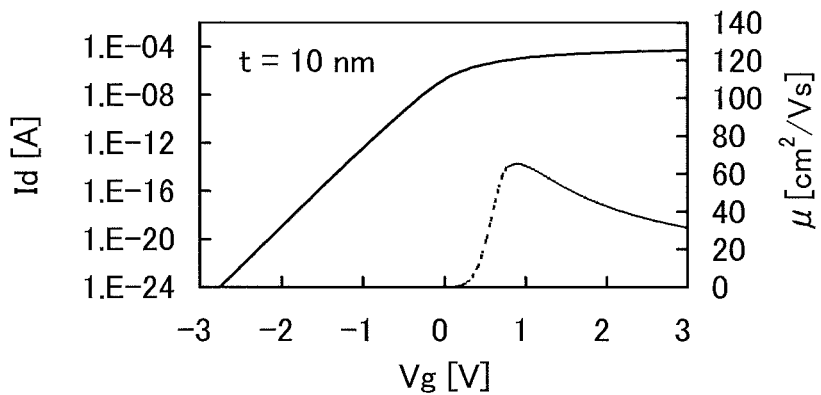
Figure 18C:
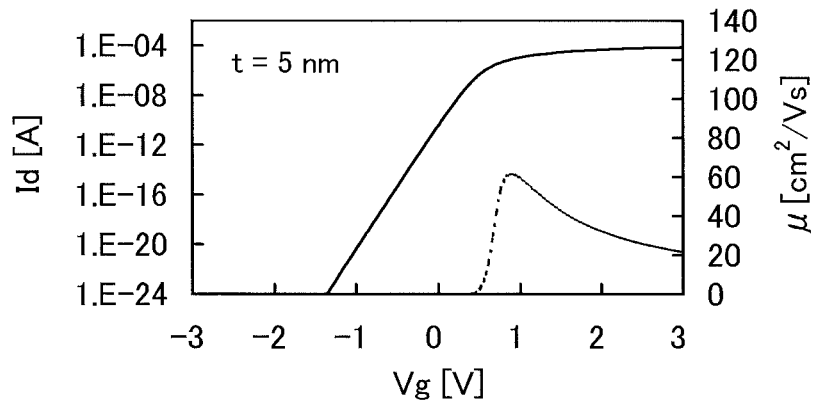

FIGS. 18A to 18C show the gate voltage $V_g$ dependence of the drain current $I_d$ (a solid line) and the mobility μ (a dotted line) of the transistor having the structure in FIG. 20B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
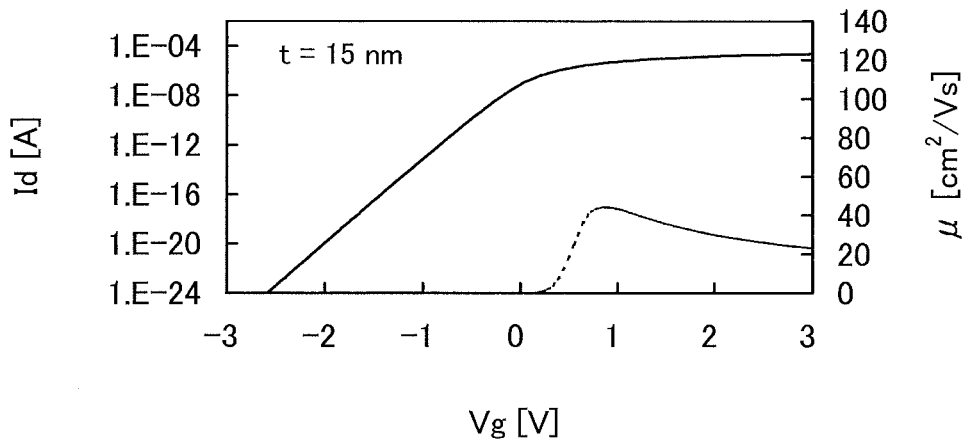
FIGS. 19A to 19C each show gate voltage dependence of drain current and mobility, obtained by calculation.
Figure 19B:
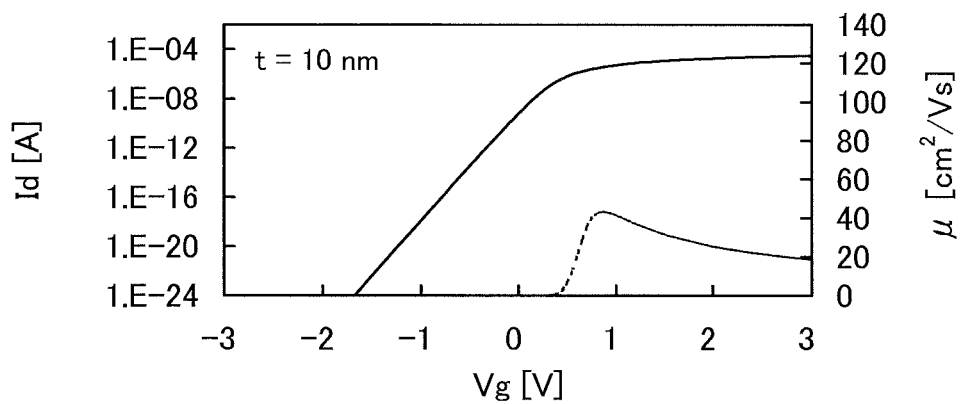
Figure 19C:
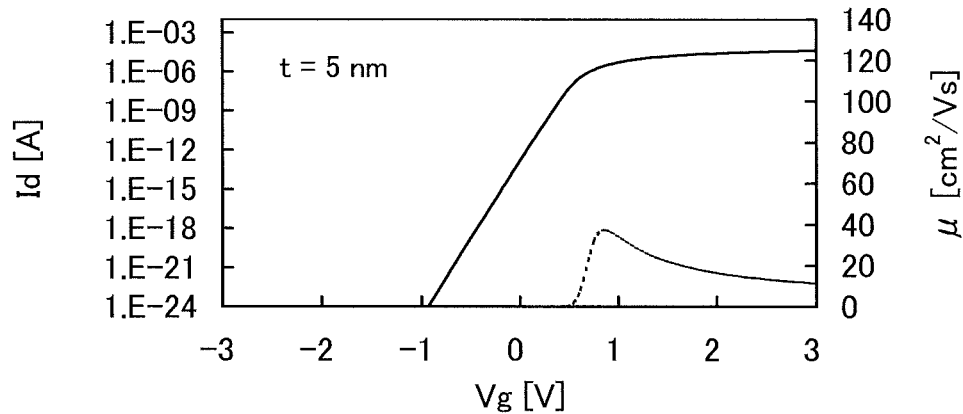
Figure 20A:
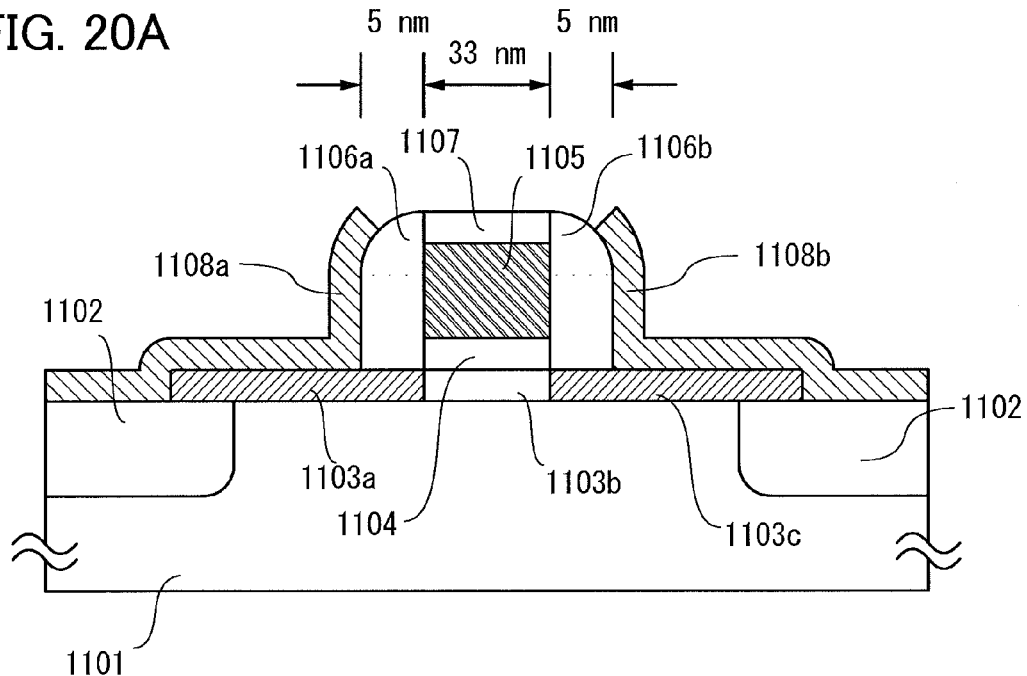
FIGS. 20A and 20B each illustrate a cross-sectional structure of a transistor used in calculation.
Figure 20B:
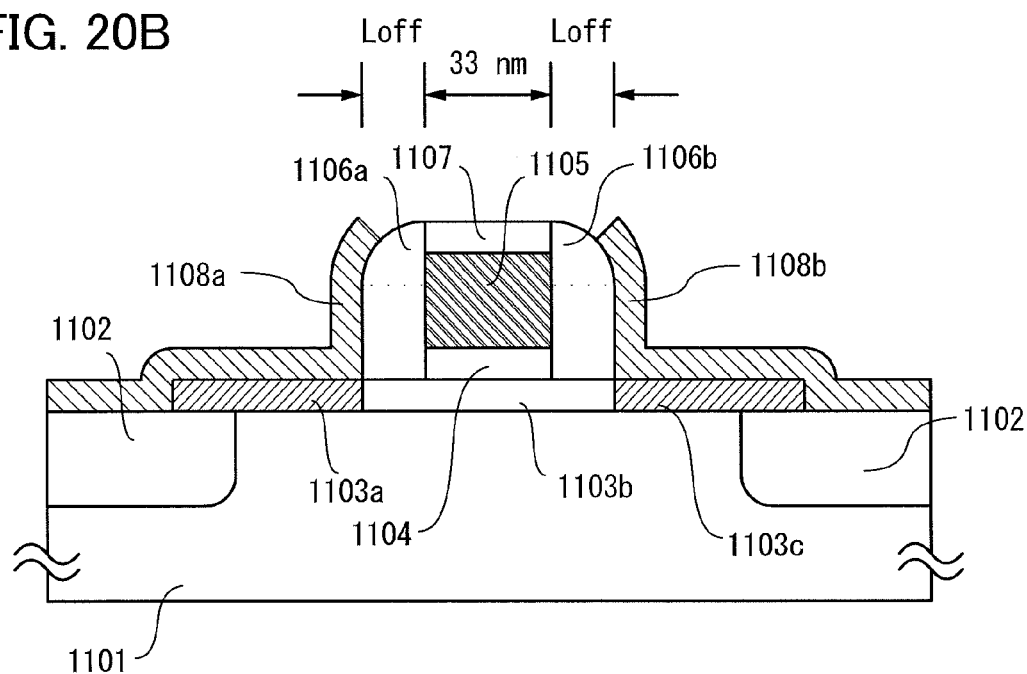

FIGS. 19A to 19C show the gate voltage dependence of the drain current $I_d$ (a solid line) and the mobility μ (a dotted line) of the transistor having the structure in FIG. 20B and an offset length $L_{off}$ of 15 nm. The drain current $I_d$ is obtained by calculation under the assumption that the drain voltage is +1 V and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 17A to 17C, approximately 60 cm$^2$/Vs in FIGS. 18A to 18C, and approximately 40 cm$^2$/Vs in FIGS. 19A to 19C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Embodiment 4

In this embodiment, a transistor in which an oxide semiconductor including In, Sn, and Zn as main components is used as an oxide semiconductor will be described.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 21A:
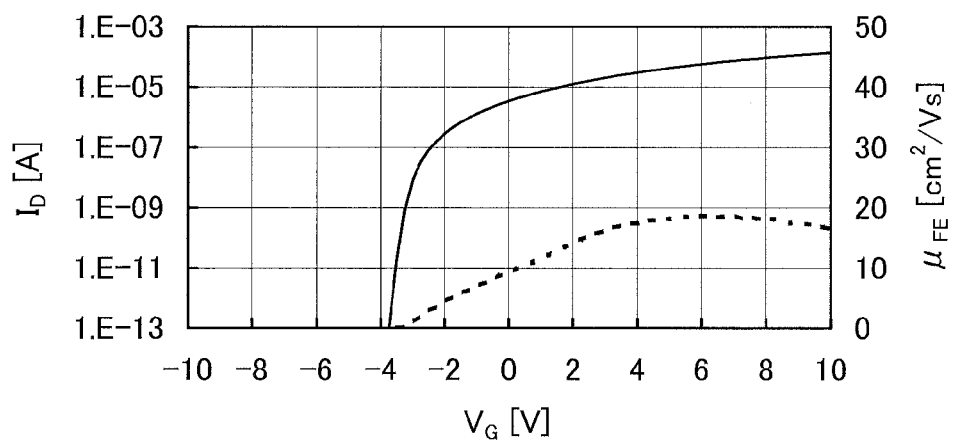
FIGS. 21A to 21C each show characteristics of a transistor.
Figure 21B:
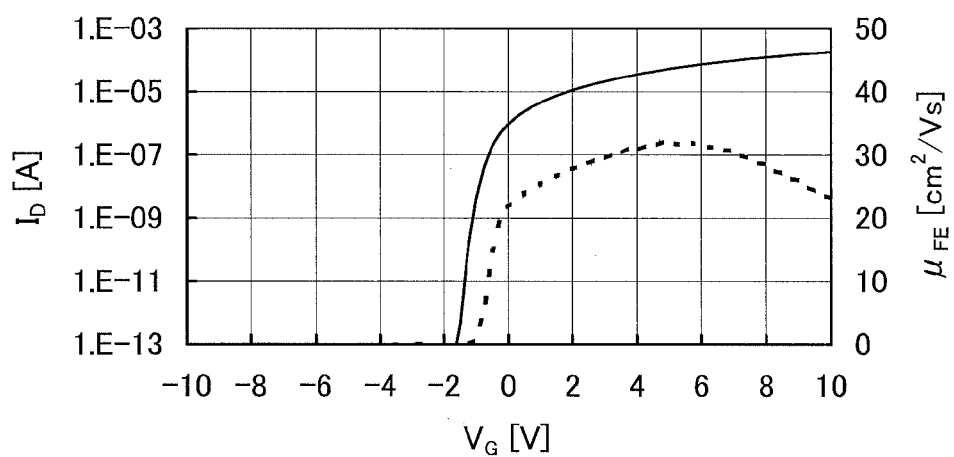
Figure 21C:
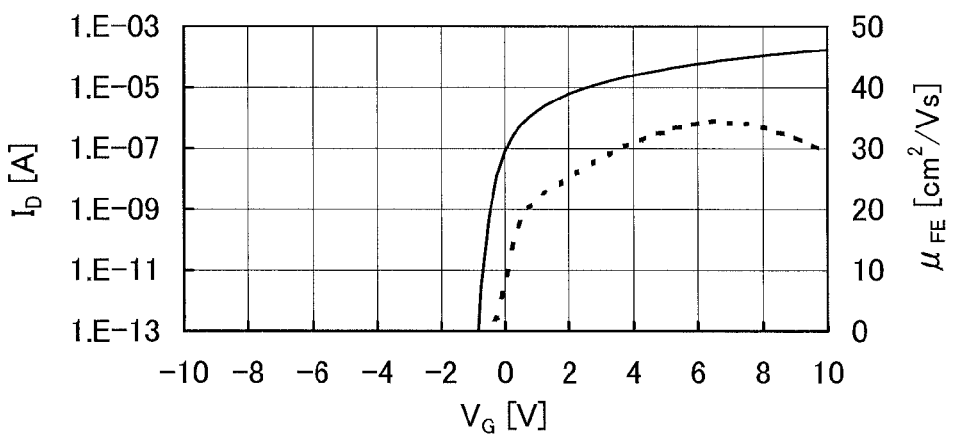

As an example, FIGS. 21A to 21C each show characteristics of a transistor that includes an oxide semiconductor film including In, Sn, and Zn as main components and having a channel length L of 3 µm and a channel width W of 10 µm, and a gate insulating film with a thickness of 100 nm. Note that $V_d$ was set to 10 V.

FIG. 21A shows characteristics of a transistor whose oxide semiconductor film including In, Sn, and Zn as main components was formed by sputtering without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 21B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 21C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 21A and 21B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_{ds}$ of 10 V. Note that $V_{ds}$ refers to a drain voltage (a potential difference between the drain and the source). Then, the substrate temperature was set to 150° C. and $V_{ds}$ was set to 0.1 V. After that, $V_g$ of 20 V was applied so that the intensity of an electric field applied to gate insulating films was 2 MV/cm, and the condition was kept for one hour. Next, $V_g$ was set to 0 V. Then, $V_g$–$I_d$ characteristics of the transistors were measured at a substrate temperature of 25° C. and $V_{ds}$ of 10 V. This process is called a positive BT test.

In a similar manner, first, $V_g$–$I_d$ characteristics of the transistors were measured at a substrate temperature of 25° C. and $V_{ds}$ of 10 V. Then, the substrate temperature was set at 150° C. and $V_{ds}$ was set to 0.1 V. After that, $V_g$ of −20 V was applied so that the intensity of an electric field applied to the gate insulating films was −2 MV/cm, and the condition was kept for one hour. Next, $V_g$ was set to 0 V. Then, $V_g$–$I_d$ characteristics of the transistors were measured at a substrate temperature of 25° C. and $V_{ds}$ of 10 V. This process is called a negative BT test.

Figure 22A:
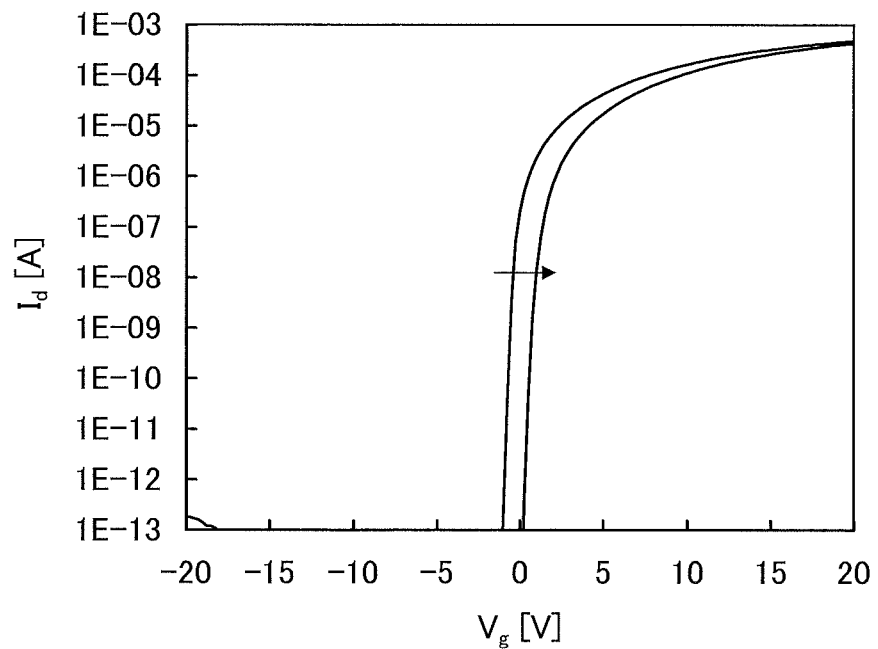
FIGS. 22A and 22B each show characteristics of a transistor.
Figure 22B:
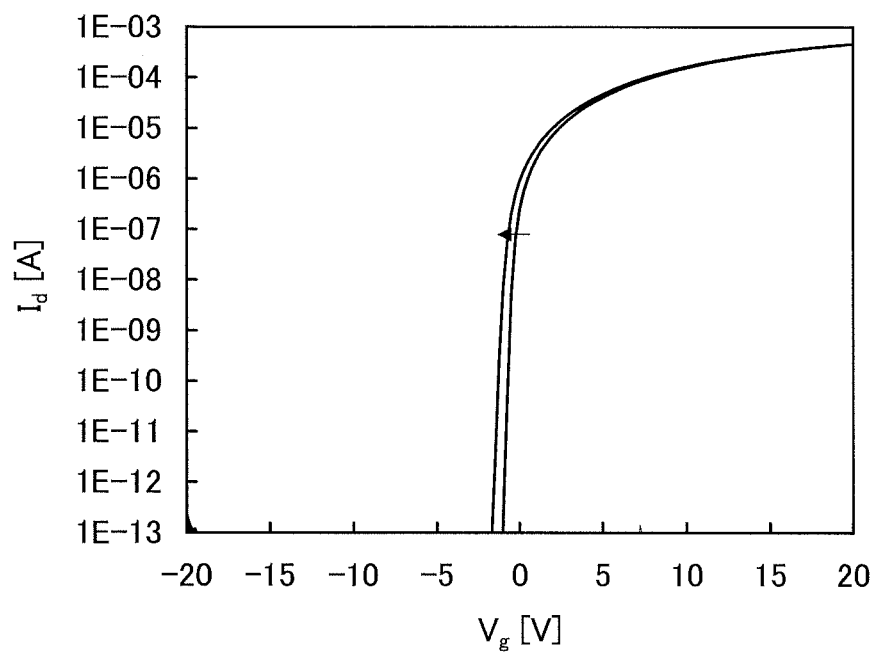
Figure 23A:
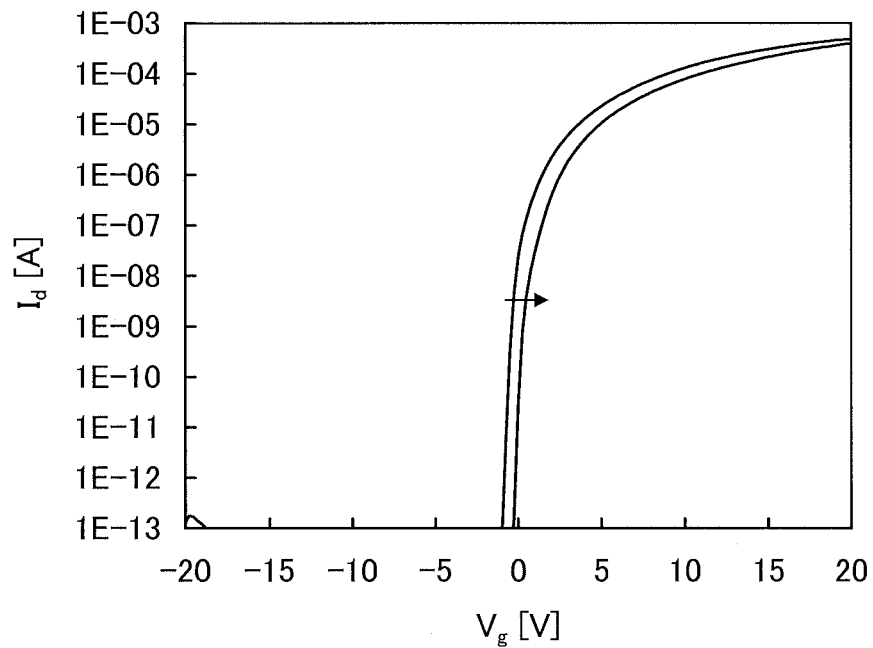
FIGS. 23A and 23B each show characteristics of a transistor.
Figure 23B:
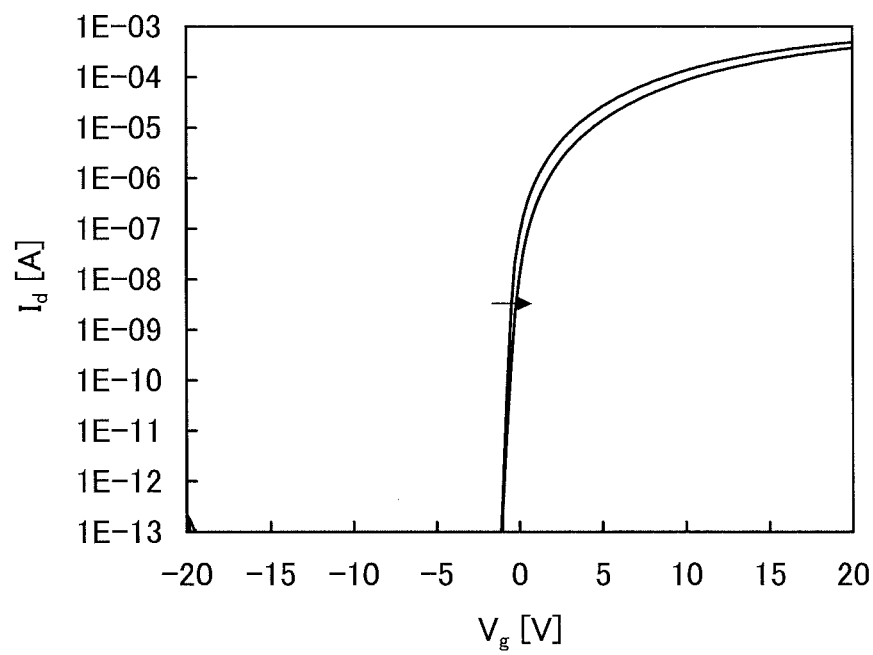

FIGS. 22A and 22B show results of the positive BT test and the negative BT test, respectively, of Sample 1. FIGS. 23A and 23B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface between the oxide semiconductor and a film in contact with the oxide semiconductor; when excess oxygen is included in the oxide semiconductor by the heat treatment, oxygen vacancy caused constantly can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 26:
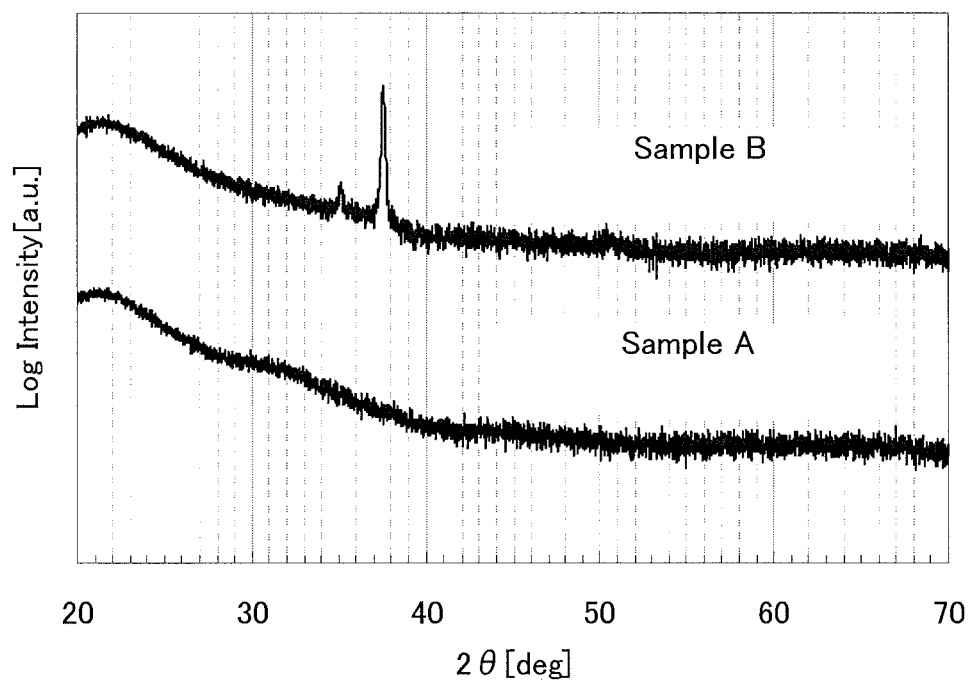
FIG. 26 shows XRD spectra of oxide materials.

FIG. 26 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 27:
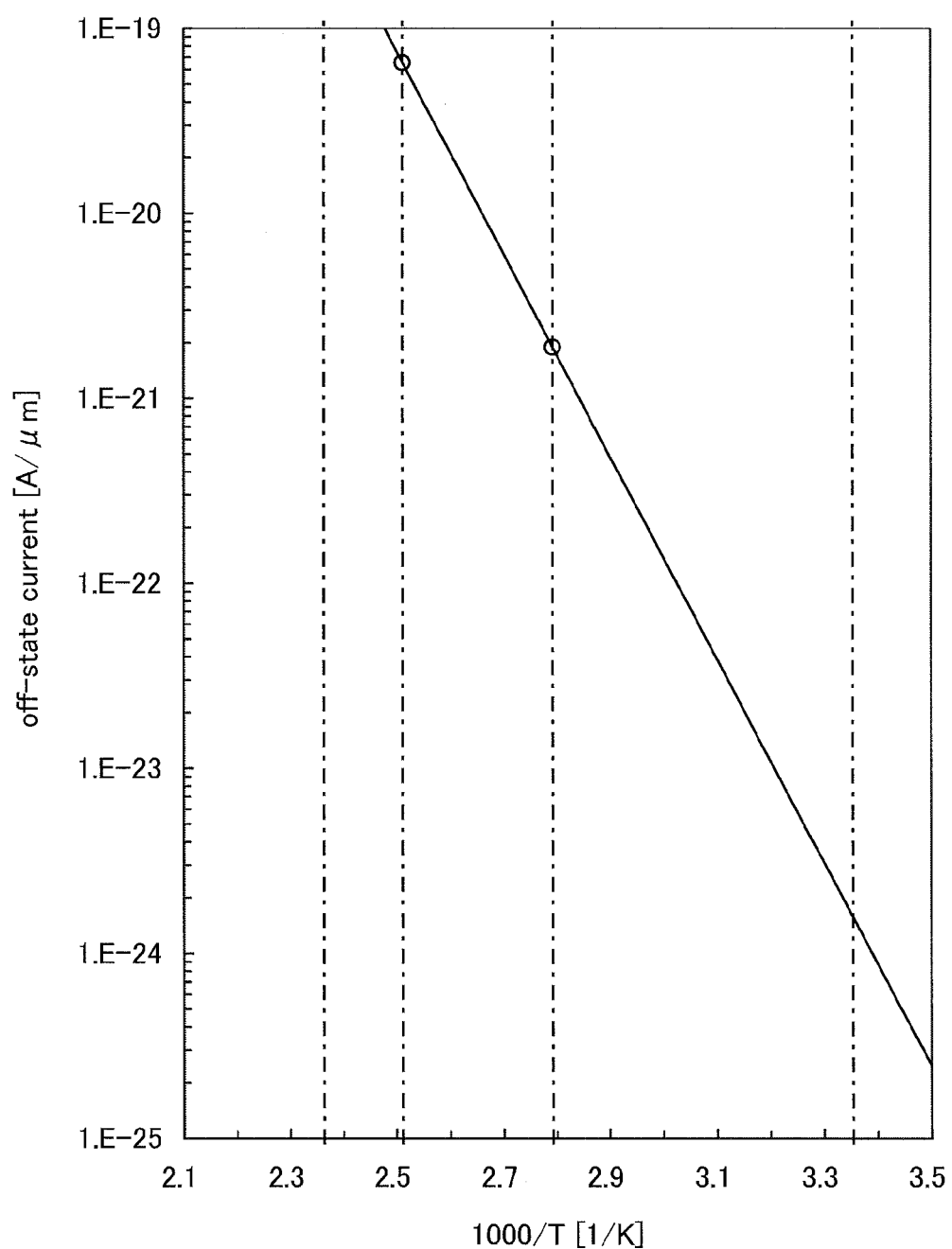
FIG. 27 shows characteristics of a transistor.

FIG. 27 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 27, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation of the film, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 24:
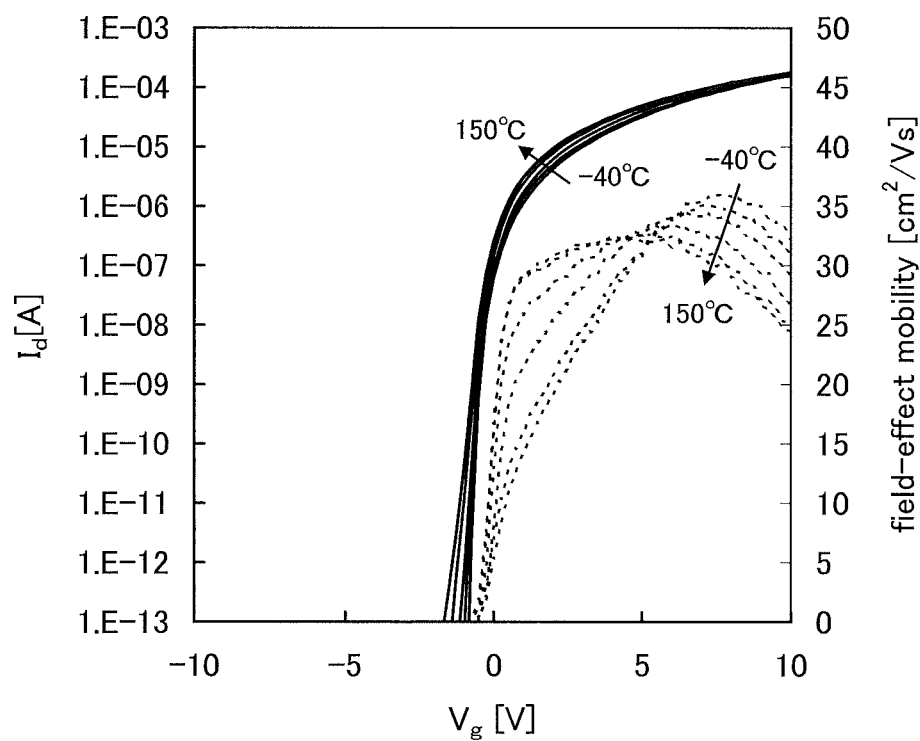
FIG. 24 shows characteristics of a transistor.
Figure 25A:
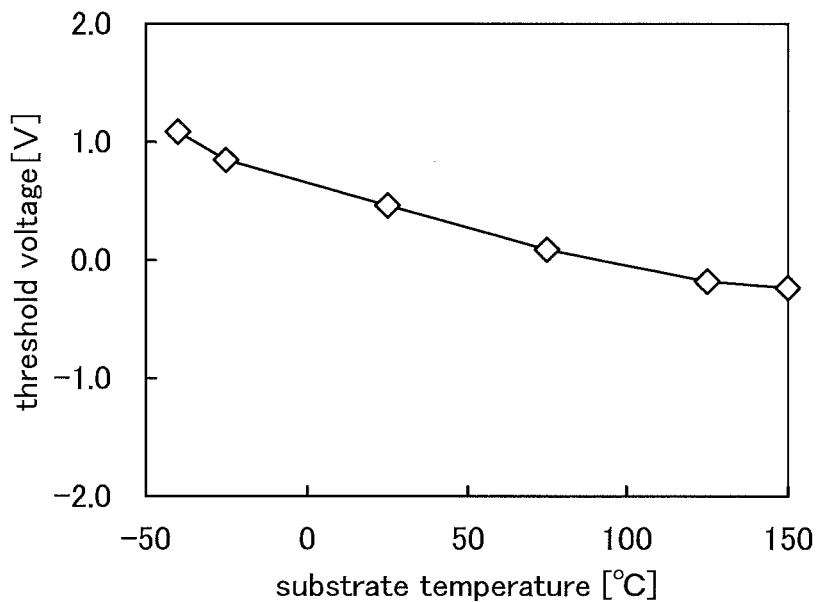
FIGS. 25A and 25B each show characteristics of a transistor.

FIG. 24 shows the $V_g$ dependence of $I_d$ (a solid line) and field-effect mobility (a dotted line). FIG. 25A shows a relation between the substrate temperature and the threshold voltage, and FIG. 25B shows a relation between the substrate temperature and the field-effect mobility.

From FIG. 25A, it is found that the threshold voltage gets lower as the substrate temperature increases. Note that the threshold voltage is decreased from 1.09 V to −0.23 V in the range from −40° C. to 150° C.

Figure 25B:
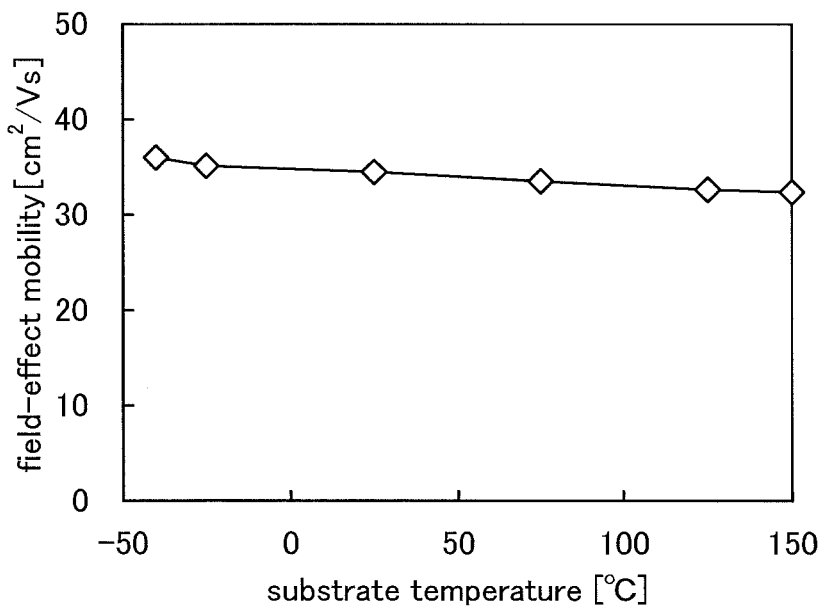

From FIG. 25B, it is found that the field-effect mobility gets lower as the substrate temperature increases. Note that the field-effect mobility is decreased from 36 $cm^2$/Vs to 32 $cm^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

Example 1

In this example, an example of a transistor in which an In—Sn—Zn—O film is used as an oxide semiconductor film will be described with reference to FIGS. 28A and 28B.

Figure 28A:
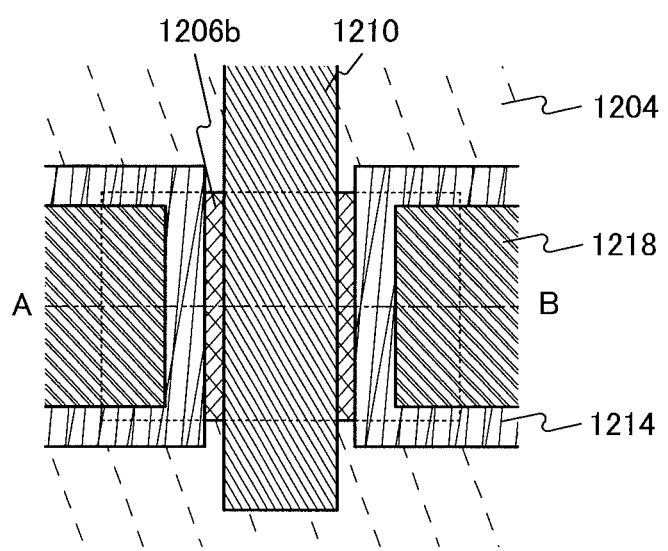
FIGS. 28A and 28B are a plan view and a cross-sectional view of a semiconductor device.
Figure 28B:
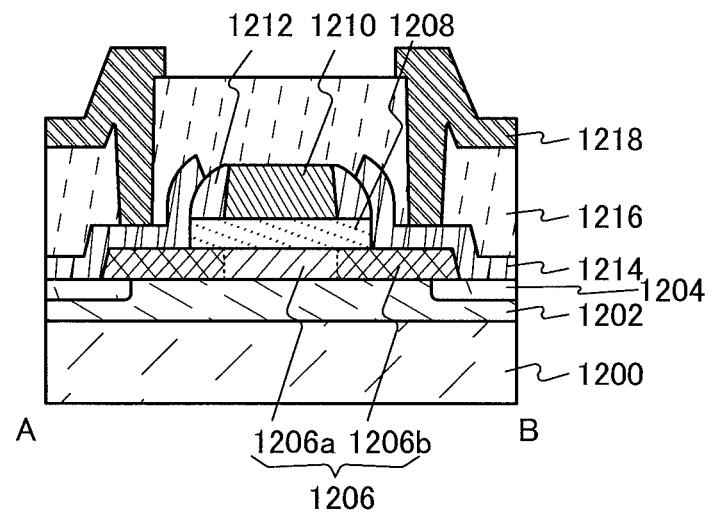

FIGS. 28A and 28B are a top view and a cross-sectional view of a coplanar transistor having a top-gate top-contact structure. FIG. 28A is the top view of the transistor. FIG. 28B illustrates cross section A-B along dashed-dotted line A-B in FIG. 28A.

The transistor illustrated in FIG. 28B includes a substrate 1200; a base insulating film 1202 provided over the substrate 1200; a protective insulating film 1204 provided in the periphery of the base insulating film 1202; an oxide semiconductor film 1206 that is provided over the base insulating film 1202 and the protective insulating film 1204 and includes a high-resistance region 1206a and low-resistance regions 1206b; a gate insulating film 1208 provided over the oxide semiconductor film 1206; a gate electrode 1210 provided to overlap with the oxide semiconductor film 1206 with the gate insulating film 1208 positioned therebetween; a sidewall insulating film 1212 provided in contact with a side surface of the gate electrode 1210; a pair of electrodes 1214 provided in contact with at least the low-resistance regions 1206b; an interlayer insulating film 1216 provided to cover at least the oxide semiconductor film 1206, the gate electrode 1210, and the pair of electrodes 1214; and a wiring 1218 provided to be connected to at least one of the pair of electrodes 1214 through an opening formed in the interlayer insulating film 1216.

Although not illustrated, a protective film may be provided to cover the interlayer insulating film 1216 and the wiring 1218. With the protective film, a minute amount of leakage current generated by surface conduction of the interlayer insulating film 1216 can be reduced, so that the off-state current of the transistor can be reduced.

Example 2

In this example, another example of a transistor in which an In—Sn—Zn—O film is used as an oxide semiconductor film will be described.

Figure 29A:
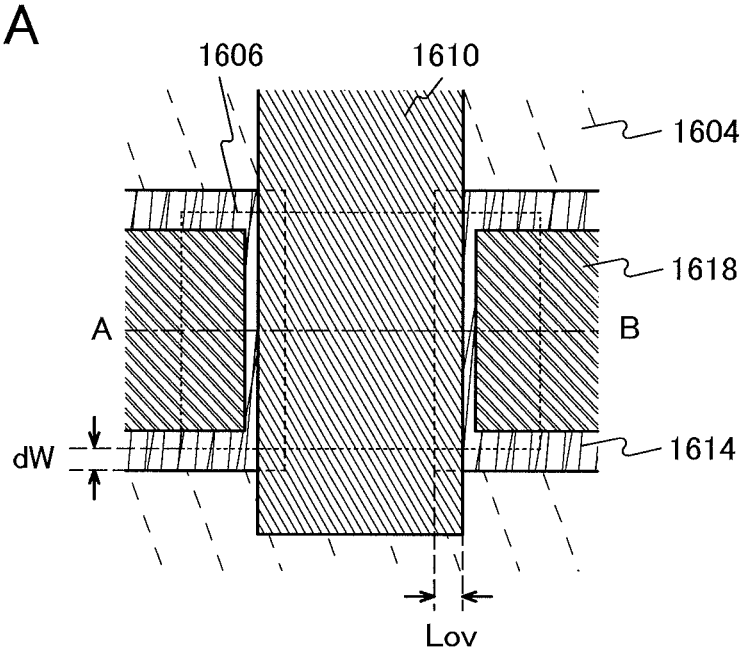
FIGS. 29A and 29B are a plan view and a cross-sectional view of a semiconductor device.
Figure 29B:
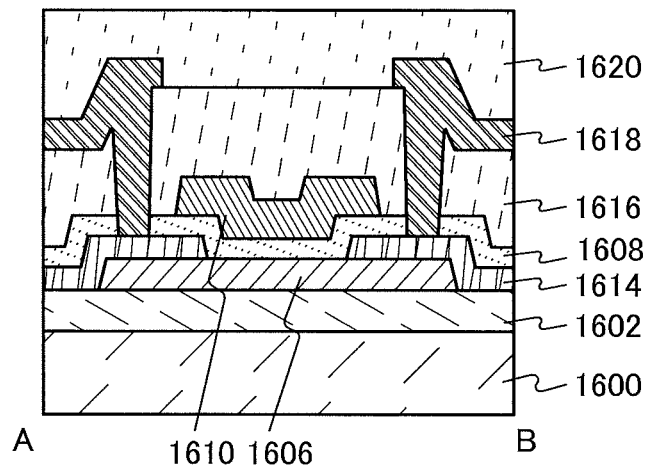

FIGS. 29A and 29B are a top view and a cross-sectional view illustrating a structure of a transistor. FIG. 29A is the top view of the transistor. FIG. 29B is a cross-sectional view along dashed-dotted line A-B in FIG. 29A.

The transistor illustrated in FIG. 29B includes a substrate 1600; a base insulating film 1602 provided over the substrate 1600; an oxide semiconductor film 1606 provided over the base insulating film 1602; a pair of electrodes 1614 in contact with the oxide semiconductor film 1606; a gate insulating film 1608 provided over the oxide semiconductor film 1606 and the pair of electrodes 1614; a gate electrode 1610 provided to overlap with the oxide semiconductor film 1606 with the gate insulating film 1608 positioned therebetween; an interlayer insulating film 1616 provided to cover the gate insulating film 1608 and the gate electrode 1610; wirings 1618 connected to the pair of electrodes 1614 through openings formed in the interlayer insulating film 1616; and a protective film 1620 provided to cover the interlayer insulating film 1616 and the wirings 1618.

As the substrate 1600, a glass substrate was used. As the base insulating film 1602, a silicon oxide film was used. As the oxide semiconductor film 1606, an In—Sn—Zn—O film was used. As the pair of electrodes 1614, a tungsten film was used. As the gate insulating film 1608, a silicon oxide film was used. The gate electrode 1610 had a stacked structure of a tantalum nitride film and a tungsten film. The interlayer insulating film 1616 had a stacked structure of a silicon oxynitride film and a polyimide film. The wirings 1618 had a stacked structure in which a titanium film, an aluminum film, and a titanium film were formed in this order. As the protective film 1620, a polyimide film was used.

Note that in the transistor having the structure illustrated in FIG. 29A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

This application is based on Japanese Patent Application serial No. 2010-181499 and No. 2011-107887 filed with Japan Patent Office on Aug. 16, 2010 and May 13, 2011, respectively, the entire contents of which are hereby incorporated by reference.

What is claimed is:

1. A semiconductor device comprising:
   a first transistor including a gate electrically connected to a first signal line;
   a second transistor including a gate electrically connected to a second signal line different from the first signal line, and including a source and a drain, one of which is electrically connected to one of a source and a drain of the first transistor;
   a third transistor including a gate electrically connected to the other of the source and the drain of the second transistor; and
   a capacitor including a first electrode and a second electrode, the first electrode being electrically connected to one of the source and the drain of the first transistor and one of the source and the drain of the second transistor, and the second electrode being electrically connected to a fixed potential line,
   wherein each of a channel region in the first transistor and a channel region in the second transistor comprises an oxide semiconductor.

2. The semiconductor device according to claim 1, wherein a channel region in the third transistor comprises single crystal silicon.

3. The semiconductor device according to claim 1, wherein a channel region in the third transistor comprises the oxide semiconductor.

4. The semiconductor device according to claim 1, wherein the capacitor includes a first insulating layer functioning as a gate insulating film of the third transistor and a second insulating layer different from the first insulating layer, as a dielectric.

5. A semiconductor device comprising:
   a first transistor including a gate electrically connected to a first signal line, and including a source and a drain, one of which is electrically connected to a data line;
   a second transistor including a gate electrically connected to a second signal line different from the first signal line, and including a source and a drain, one of which is electrically connected to the other of the source and the drain of the first transistor;

a third transistor including a gate electrically connected to the other of the source and the drain of the second transistor, and including a source and a drain, one of which is electrically connected to a fixed potential line;

a fourth transistor including a gate electrically connected to a word line, one of a source and a drain electrically connected to a bit line, and the other of the source and the drain electrically connected to the other of the source and the drain of the third transistor; and a capacitor including a first electrode electrically connected to the other of the source and the drain of the first transistor and one of the source and the drain of the second transistor, and a second electrode electrically connected to the fixed potential line, wherein each of a channel region in the first transistor and a channel region in the second transistor comprises an oxide semiconductor.

6. The semiconductor device according to claim 5, wherein a channel region in the third transistor comprises single crystal silicon.

7. The semiconductor device according to claim 5, wherein a channel region in the third transistor comprises the oxide semiconductor.

8. The semiconductor device according to claim 5, wherein the capacitor includes a first insulating layer functioning as a gate insulating film of the third transistor and a second insulating layer different from the first insulating layer, as a dielectric.

9. A semiconductor device comprising:

a first transistor including a gate electrically connected to a first signal line, and including a source and a drain, one of which is electrically connected to a data line;

a second transistor including a gate electrically connected to a second signal line different from the first signal line, and including a source and a drain, one of which is electrically connected to the other of the source and the drain of the first transistor;

a third transistor including a gate electrically connected to the other of the source and the drain of the second transistor, and a source and a drain, one of which is electrically connected to a bit line;

a fourth transistor including a gate electrically connected to a word line, one of a source and a drain electrically connected to the other of the source and the drain of the third transistor, and the other of the source and the drain electrically connected to a fixed potential line; and a capacitor including a first electrode electrically connected to the other of the source and the drain of the first transistor and one of the source and the drain of the second transistor, and a second electrode electrically connected to the fixed potential line, wherein each of a channel region in the first transistor and a channel region in the second transistor comprises an oxide semiconductor.

10. The semiconductor device according to claim 9, wherein a channel region in the third transistor comprises single crystal silicon.

11. The semiconductor device according to claim 9, wherein a channel region in the third transistor comprises the oxide semiconductor.

12. The semiconductor device according to claim 9, wherein the capacitor includes a first insulating layer functioning as a gate insulating film of the third transistor and a second insulating layer different from the first insulating layer, as a dielectric.

* * * * *